(12) United States Patent
Schlezinger et al.

(10) Patent No.: US 12,131,930 B2
(45) Date of Patent: Oct. 29, 2024

(54) INSPECTION SYSTEM

(71) Applicant: Applied Materials, Inc., Santa Clara, CA (US)

(72) Inventors: Asaf Schlezinger, Modi'in (IL); Markus J. Stopper, Voerstetten (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 137 days.

(21) Appl. No.: 17/799,251

(22) PCT Filed: Mar. 2, 2021

(86) PCT No.: PCT/US2021/020410
§ 371 (c)(1),
(2) Date: Aug. 11, 2022

(87) PCT Pub. No.: WO2021/202029
PCT Pub. Date: Oct. 7, 2021

(65) Prior Publication Data
US 2023/0075394 A1    Mar. 9, 2023

Related U.S. Application Data
(60) Provisional application No. 63/004,286, filed on Apr. 2, 2020.

(51) Int. Cl.
*H01L 21/67* (2006.01)
*B65G 15/12* (2006.01)
(Continued)

(52) U.S. Cl.
CPC ........ *H01L 21/67288* (2013.01); *B65G 15/12* (2013.01); *B65G 47/647* (2013.01);
(Continued)

(58) Field of Classification Search
CPC ......... H01L 21/67288; H01L 21/67271; H01L 21/67706; H01L 21/67715;
(Continued)

(56) References Cited

U.S. PATENT DOCUMENTS

| | | | | |
|---|---|---|---|---|
| 6,032,577 A | * | 3/2000 | Doyle | B41F 15/0881 |
| | | | | 101/485 |
| 7,472,788 B2 | * | 1/2009 | Bonora | H01L 21/6773 |
| | | | | 198/817 |

(Continued)

FOREIGN PATENT DOCUMENTS

| | | |
|---|---|---|
| JP | H01-169928 A | 7/1989 |
| KR | 10-1998-0034116 A | 8/1998 |
| KR | 10-2016-0128856 A | 11/2016 |

OTHER PUBLICATIONS

International Search Report and Written Opinion dated Jun. 21, 2021 for Application No. PCT/US2021/020410.

*Primary Examiner* — Mark A Deuble
(74) *Attorney, Agent, or Firm* — Patterson + Sheridan, LLP

(57) ABSTRACT

Embodiments herein generally relate to inspection systems for substrates or wafers for solar cell applications. The inspection system is configured to analyze substrates or wafers for chips, cracks, and other defects. The system includes conveyor apparatuses, and the conveyor apparatuses include one or more conveyor elements. The conveyor elements are configured to transport rectangular wafers having a width between about 175 mm to about 250 mm. The conveyor elements include a first conveyor belt and a second conveyor belt to transport the substrates. The spacing of the belts reduces vibrations of the substrate edge.

17 Claims, 10 Drawing Sheets

(51) Int. Cl.
  *B65G 47/64* (2006.01)
  *B65G 49/06* (2006.01)
  *H01L 21/677* (2006.01)

(52) U.S. Cl.
  CPC ...... *B65G 49/067* (2013.01); *H01L 21/67271* (2013.01); *H01L 21/67706* (2013.01); *H01L 21/67715* (2013.01); *H01L 21/67718* (2013.01)

(58) Field of Classification Search
  CPC ............... H01L 21/67718; H01L 22/12; H01L 21/6776; B65G 15/12; B65G 47/647; B65G 49/067; B65G 49/064; B65G 49/068
  See application file for complete search history.

(56) References Cited

U.S. PATENT DOCUMENTS

| | | | |
|---|---|---|---|
| 7,988,398 B2 * | 8/2011 | Hofmeister | H01L 21/67727 156/345.31 |
| 8,829,396 B2 | 9/2014 | Rey Garcia et al. | |
| 10,406,562 B2 * | 9/2019 | Stopper | B07C 5/362 |
| 10,707,109 B2 * | 7/2020 | Morita | B65G 21/10 |
| 2009/0305441 A1 | 12/2009 | Baccini et al. | |
| 2011/0013013 A1 * | 1/2011 | Lee | G01N 21/9505 348/92 |
| 2012/0136476 A1 * | 5/2012 | Baccini | H01L 21/68771 414/800 |
| 2017/0170041 A1 * | 6/2017 | Stopper | H01L 21/6838 |

* cited by examiner

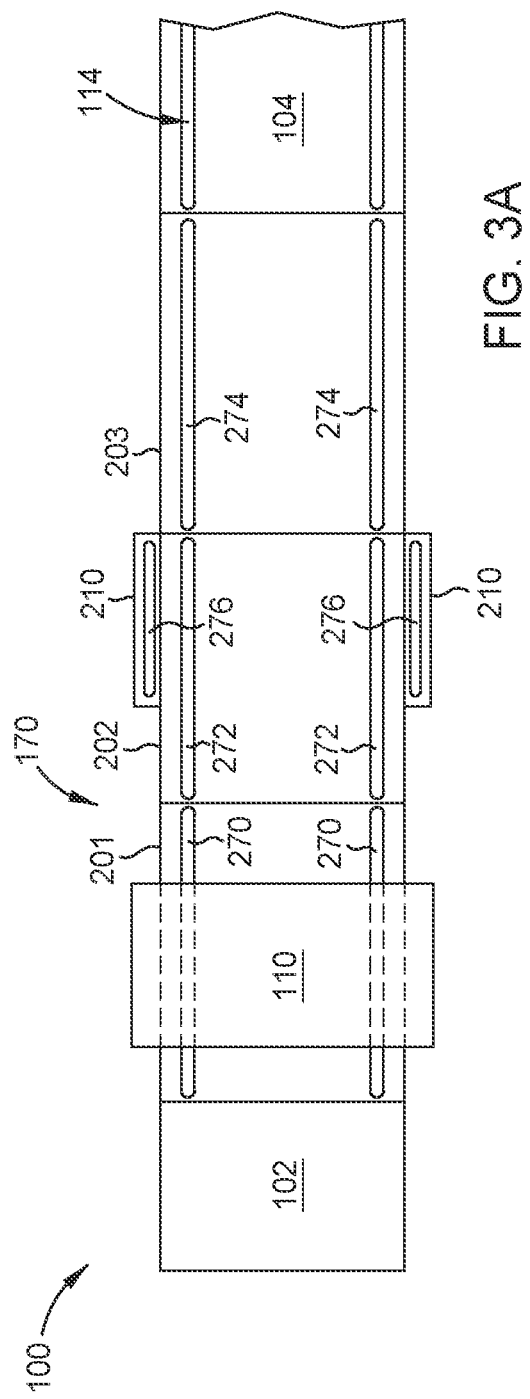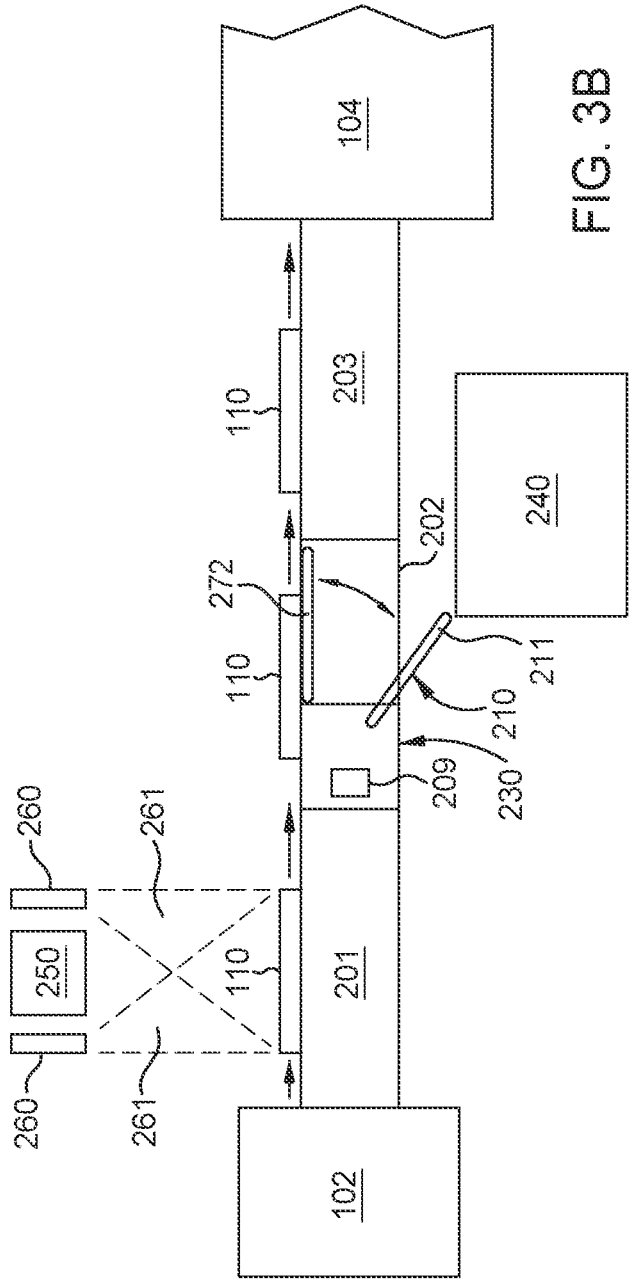

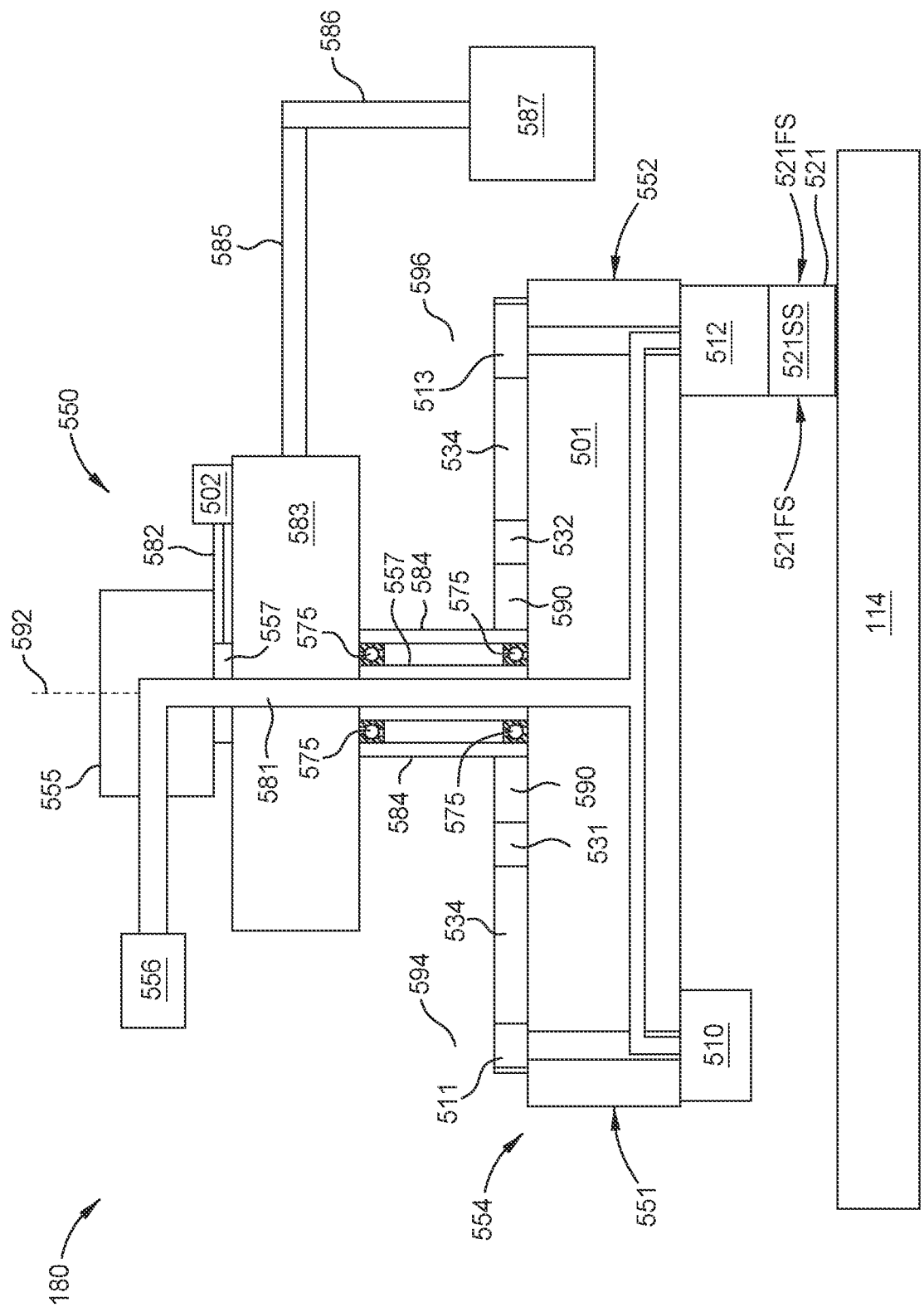

INSPECTION SYSTEM

BACKGROUND

Field

Embodiments of the present disclosure generally relate to a conveyor system and, more specifically, an inspection system having a conveyor system.

Description of the Related Art

Substrates, such as semiconductor substrates, large area substrates for display panels, solar cell substrates, and the like, are routinely inspected during processing at independent inspection stations to ensure compliance with predetermined quality control standards. Different inspection techniques provide comprehensive data regarding products and processes. However, comprehensive inspections can be time consuming, thus reducing throughput, due to the number of inspection stations needed and the resulting transfer time of moving substrates therebetween. Thus, device manufacturers are often faced with the decision of choosing between thorough inspections with burdensome inspection/transfer times, or foregoing certain inspection processes.

Typical substrate test systems can handle approximately 3,600 substrates per hour in a linear arrangement. However, as inspection processes have continued to decrease the amount of time to complete inspection steps, substrate handling apparatuses within the test system able to keep up with faster inspection times and/or additional inspection routines are needed. Often, test systems include inspection apparatuses that identify solar cell substrates with undesired defects, removing the substrates from the test system. Solar cell substrates are rectangular, thinner, and less rigid than traditional large area substrates used for display panels, so inspection systems for large area substrates may not be appropriate for solar cell substrates.

One drawback is that conventional test systems are not configured to accurately inspect rectangular substrates moving at high rates of speed. In conventional test systems, rectangular large area substrates are prone to having large vibrations at the substrate edge when moving rapidly. When the edges of the substrates vibrate, image quality of the substrate edges captured by visual inspection equipment is often poor. This poor image quality increases false positives or negatives of substrate damage, resulting in substrates being inaccurately identified as good or damaged, and making substrate inspection undesirably unreliable.

Therefore, what is needed in the art is an improved inspection system.

SUMMARY

Embodiments herein generally relate to conveyor systems that transfer rectangular substrates with vibrations tolerable for visual inspection. Embodiments herein also generally relate to inspection systems for rectangular substrates for solar cell applications. The inspection systems disclosed herein are configured to accurately image edge defects in rectangular substrates.

In one example, a system for inspecting a rectangular wafer having a width between about 175 mm and about 250 mm is provided. The system includes one or more metrology stations configured to inspect the rectangular wafer, and a conveyor system configured to transport the rectangular wafer while the one or more metrology stations inspect the rectangular wafer. The conveyor system includes a first conveyor apparatus and a second conveyor apparatus. Each of the first conveyor apparatus and the second conveyor apparatus include one or more conveyor elements. The one or more conveyor elements include a first conveyor belt and a second conveyor belt parallel to the first conveyor belt. The first conveyor belt and the second conveyor belt are configured to transport the rectangular wafer having the width between about 175 mm to about 250 mm in a direction of travel while the width of the substrate is orthogonal to the direction of travel. The first conveyor belt and the second conveyor belt are spaced apart by a belt separation pitch between 90 mm and 150 mm.

In another example, a system for inspecting a rectangular wafer having a width between about 175 mm and about 250 mm is provided. The system includes a front end, one or more metrology stations configured to inspect the rectangular wafer, and a conveyor system configured to transport the rectangular wafer while the one or more metrology stations inspect the rectangular wafer. The conveyor system includes a first conveyor apparatus and a second conveyor apparatus. Each of the first conveyor apparatus and the second conveyor apparatus include one or more conveyor elements. The one or more conveyor elements include a first conveyor belt and a second conveyor belt parallel to the first conveyor belt. The first conveyor belt and the second conveyor belt are configured to transport the rectangular wafer having the width between about 175 mm to about 250 mm in a direction of travel while the width of the substrate is orthogonal to the direction of travel. The first conveyor belt and the second conveyor belt are spaced apart by a belt separation pitch between 90 mm and 150 mm. The front end is configured to transport the rectangular wafer to the conveyor system.

In yet another example, a method of transporting a rectangular wafer having a width between about 175 mm to about 250 mm is provided. The method includes transporting the rectangular substrate on a conveyor system and transporting the rectangular substrate to a rotary sorting system. The conveyor system includes a first conveyor apparatus and a second conveyor apparatus. Each of the first conveyor apparatus and the second conveyor apparatus include one or more conveyor elements. The one or more conveyor elements include a first conveyor belt and a second conveyor belt parallel to the first conveyor belt. The first conveyor belt and the second conveyor belt are configured to transport the rectangular wafer having the width between about 175 mm to about 250 mm in a direction of travel while the width of the substrate is orthogonal to the direction of travel. The first conveyor belt and the second conveyor belt are spaced apart by a belt separation pitch between 90 mm and 150 mm. The rectangular substrate is transported on the conveyor system at a speed of about 300 m/s to about 600 m/s.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

FIG. 3A illustrates a top plan view of a conveyor inspection system, according to one embodiment.

FIG. 3B illustrates a side plan view of a conveyor inspection system in a first orientation, according to one embodiment.

FIG. 5E illustrates a side plan view of a substrate rotator in a third configuration, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein generally relate to conveyor systems that transfer rectangular substrates with vibrations tolerable for visual inspection. Embodiments herein also generally relate to inspection systems for rectangular substrates for solar cell applications. The inspection systems disclosed herein are configured to accurately image edge defects in rectangular substrates. The inspection system is configured to analyze substrates for chips, cracks, and other defects on a rapidly moving rectangular substrate. The inspection system includes conveyor systems, and the conveyor systems include one or more conveyor elements. The conveyor elements are configured to transport rectangular substrates with large widths (i.e., the dimension of the substrate orthogonal to the direction of travel along the conveyor elements). The conveyor elements include belts to transport the substrates. The spacing of the belts is selected to reduce vibrations of the substrate edge. Reducing vibrations of the substrate edges allows for more accurate imaging of the substrate edges. Accurate imaging if the substrate edges reduces false positives or negatives of substrate side imaging, reducing waste of substrates that have been inaccurately identified as damaged. Embodiments disclosed herein can be useful for, but are not limited to, inspection systems used for measuring defects of rectangular solar cell substrates.

As used herein, the term "about" refers to a +/−10% variation from the nominal value. It is to be understood that such a variation can be included in any value provided herein.

Figure 1A:
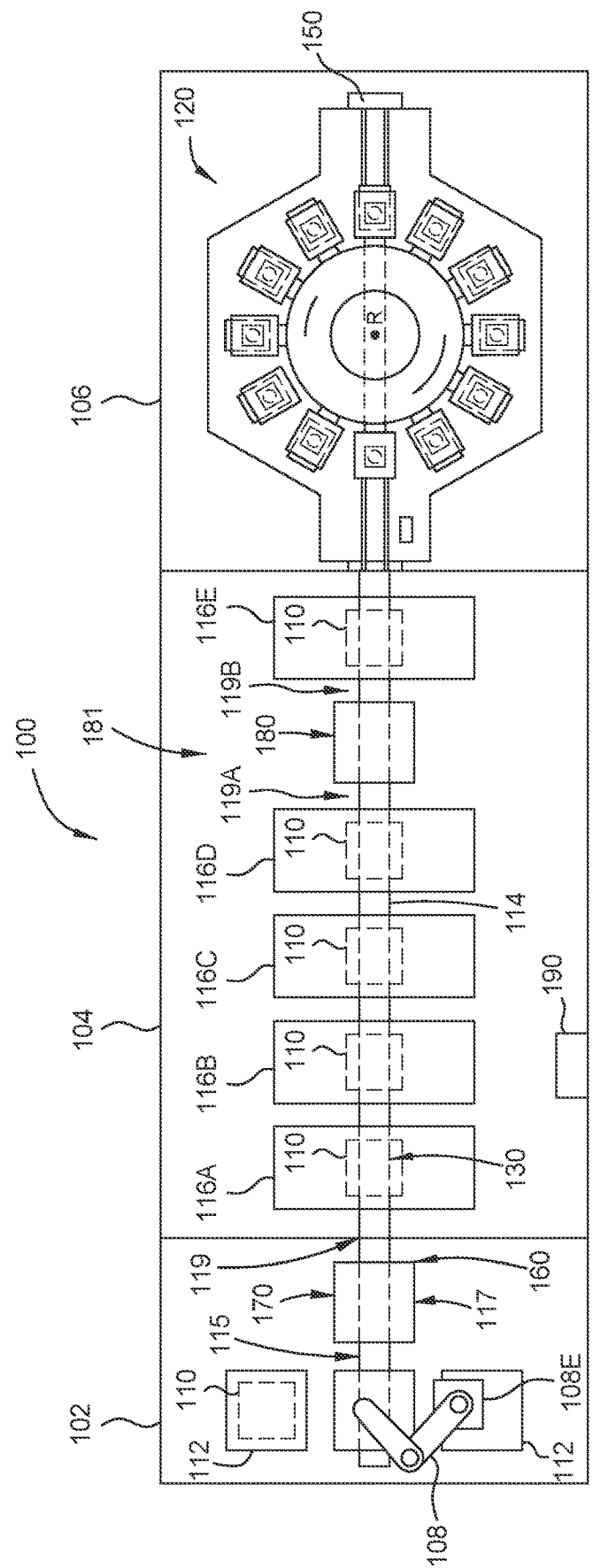
FIG. 1A illustrates a top plan view of an inspection (e.g., test) system, according to one embodiment.

FIG. 1A illustrates a top plan view of an inspection system (alternatively referred to as a test system, or a system) 100, according to one embodiment. The inspection system 100 is configured to inspect and sort a plurality of substrates (alternatively referred to as wafers) 110. As shown, the inspection system 100 includes a front end 102, a conveyor system 114, a modular inspection unit 104, a sorting unit 106, and a controller 190. The front end 102 can be a loading unit. The conveyor system 114 is configured to transport substrates 110 from the loading unit (e.g., front end 102) to the modular inspection unit 104. The modular inspection unit 104 can be a metrology unit. The sorting unit 106 can be a sorting module that utilizes grippers to transfer substrates into bins in accordance to information obtained from instruction of the substrates in the inspection unit 104. The front end 102, the modular inspection unit 104, and the sorting unit 106 can be disposed linearly relative to another, for example, with the conveyor system 114 extending in a linear or substantially linear orientation through the front end 102, the modular inspection unit 104, and the sorting unit 106 of the inspection system 100. Alternatively, the front end 102, the modular inspection unit 104, and the sorting unit 106 may be arranged in another orientation, such as an "L-shape".

The front end 102 is configured to transport substrates 110 into the rest of the inspection system 100 via the conveyor system 114. As shown, the conveyor system 114 includes a first conveyor apparatus 115, an intermediate conveyor apparatus 117, and a second conveyor apparatus 119. Each of the first conveyor apparatus 115, the intermediate conveyor apparatus 117, and the second conveyor apparatus 119 includes one or more conveyor elements 160. The conveyor system 114, and thus the first conveyor apparatus 115, the intermediate conveyor apparatus 117, and the second conveyor apparatus 119, can further include any device that is configured to carry a substrate through the inspection system 100. For example, each of the conveyor elements 160 may include one or more of belts, rollers, webs, or other device/mechanism suitable for transporting the substrate through the inspection system 100. The conveyor system 114 can further include a carrier or pallet to hold the substrate while moving along the conveyor elements 160, where the carrier or pallet is moved by a drive mechanism. Each of the first conveyor apparatus 115, the intermediate conveyor apparatus 117, and the second conveyor apparatus 119 can be individually driven.

The intermediate conveyor apparatus 117 is part of a conveyor inspection system 170. The conveyor inspection system 170 is configured to sort undesired substrates 110 and remove the undesired substrates from the conveyor system 114 before the substrates can enter the modular inspection unit 104 of the inspection system 100. The conveyor inspection system 170 is also configured to transmit substrates 110 suitable for further testing and/or inspection to the second conveyor apparatus 119 for transport to the modular inspection unit 104. More details about the conveyor inspection system 170 are given in the description of FIG. 3 below.

The conveyor system 114 can be a motor-driven conveyor system and can include one or more conveyors, such as transportation belts or tracks driven by an actuator through rollers and/or drive gears. The conveyor system 114 can be disposed in a linear arrangement to transfer substrates through the modular inspection unit 104. As such, the conveyor system 114 is disposed within the modular inspection unit 104 and facilitates the transfer of substrates 110 through the modular inspection unit 104. Additional modular inspection units can be positioned between the front end 102 and the modular inspection unit 104, and/or between the modular inspection unit 104 and the sorting unit 106, and/or following the sorting unit 106 to facilitate expansion of the inspection system 100.

As shown, the front end 102 includes a transfer robot 108. The transfer robot 108 is configured to transfer substrates 110 from one or more cassettes 112 positioned within the front end 102 to the first conveyor apparatus 115. Substrates loaded on the first conveyor apparatus 115 are transferred to the intermediate conveyor apparatus 117 and to the second conveyor apparatus 119 for further transport to the modular inspection unit 104. The transfer robot 108 includes support elements 108E, such as a suction element, end effector, and gripper clamp for gripping and transferring substrates 110.

The front end 102 receives one or more cassettes 112. Each cassette 112 contains substrates 110 in a stacked configuration. The substrates 110 can be stacked horizontally or vertically. For example, each cassette 112 includes a plurality of slots therein, and each slot is configured to hold a substrate 110. The cassette 112 can be positioned such that the substrates 110 are positioned one over another. The substrates 110 are transferred from the cassettes 112 via a transfer robot 108 to the conveyor system 114 for transfer through the inspection system 100 via the conveyor system. The front end 102 includes a controller 190. The controller 190 may include a graphical user interface adapted to present information related to operations occurring in the front end 102, including processing metrics, lot numbers, and the like. In one example, the controller 190 includes a touch screen interface.

The modular inspection unit 104 is configured to make one or more measurements on the substrates 110 passing therethrough. As shown, the modular inspection unit 104 includes one or more metrology stations 116, a substrate edge metrology system 181, and a substrate rotator 180. The conveyor system 114 is configured to transport the substrate 110 while the one or more metrology stations 116 inspect the substrate. In the embodiment of FIG. 1A, the modular inspection unit 104 includes five metrology stations 116A-116E, two of which are part of the substrate edge metrology system 181. In the embodiment depicted in FIG. 1A, metrology station 116D and 116E, which are separated by the substrate rotator 180, are part of the substrate edge metrology system 181. It is contemplated that the inspection system 100 can be modified by adding or subtracting metrology stations to the modular inspection unit 104, as space permits, rather than adding a second modular inspection unit, thus increasing throughput and/or the number of metrology processes performed.

The metrology stations 116 can include any of the following: a micro-crack inspection unit, a thickness measuring unit, a resistivity measuring unit, a photoluminescence unit, a geometry inspection unit, a saw mark detection unit, a stain detection unit, a chip detection unit, and/or a crystal fraction detection unit. The micro-crack inspection unit can be configured to inspect substrates for cracks, as well as to determine crystal fraction of a substrate. The geometry inspection unit can be configured to analyze surface properties of a substrate. The saw mark detection unit can be configured to identify saw marks including groove, step, and double step marks on a substrate. The metrology stations 116 can also include other examples beyond those listed above. Each of the metrology stations 116 is used to deliver one or more metrology values to the sorting unit 106, as described in detail below.

The metrology station 116B can be a thickness measuring unit adapted to measure substrate thickness. Metrology station 116B can also, or alternatively, measure resistivity of a substrate 110. The metrology station 116B receives substrates 110 transferred along the conveyor system 114 subsequent to inspection in the metrology station 116A, which is any type of metrology station. The metrology station 116B is disposed along the in-line path of the substrates 110 defined by the conveyor system 114 downstream of the location of the metrology station 116A. The metrology station 116B performs one or more inspection processes on a substrate 110. The inspection process occurring at metrology station 116B can be performed while the substrate is in motion. It is contemplated that the motion of the substrate 110 can be stopped at the metrology station 116B to facilitate increased accuracy of inspection.

The metrology station 116C can be a photoluminescence unit configured to detect defects and/or perform impurity measurements. In addition, another metrology station (not shown) can be a geometry inspection unit configured to analyze the geometry and surface properties of the substrate 110.

Metrology station 116C receives substrates 110 transferred along the conveyor system 114 subsequent to the inspection thereof in the metrology station 116B. Metrology station 116D receives substrates 110 transferred along the conveyor system 114 subsequent to the inspection thereof in the metrology station 116C. Metrology station 116E receives substrates 110 transferred along the conveyor system 114 subsequent to the inspection thereof in the metrology station 116D, and so forth if additional metrology units are utilized in a linear path as shown. Additionally, in some embodiments, non-linear path inspection is utilized. As such, substrates 110 can be transferred between metrology stations 116A-116E in a non-linear fashion, such as in a circular fashion or in an arcuate fashion. The substrate rotator 180 picks substrates exiting the metrology station 116D on the conveyor system 114, rotates the substrates, then returns the rotated substrates back to the conveyor system 114 for transport to the metrology station 116E.

The substrate edge metrology system 181 is configured to measure defects on the edge of the substrate 110. As shown, the substrate edge metrology system includes metrology stations 116D, 116E, and substrate rotator 180. Metrology stations 116D, 116E are both chip side inspection (CSI) tools, according to one embodiment. The CSI tool includes an image capturing device, such as a camera, a charge-coupled device (CCD), and the like, that are suitable for capturing images of the side of each substrate 110 as the substrate passes the metrology stations 116D, 116E to check for chips, cracks, or other defects on the side of the substrate. The CSI tools are configured to image the sides of the substrates 110 parallel to the direction the substrate moves down the conveyor system 114. In the example illustrated in FIG. 1A, each metrology station 116D, 116E has CSI tools positioned to obtain images of two opposing sides of the substrate, typically the sides of the substrate that have an orientation that is parallel with the direction of travel of the substrate along a portion of the conveyor system 114 disposed within the inspection unit 104. In one example, the CSI tools are positioned to obtain images of two opposing sides of the substrate while the substrate remains on the conveyor system 114 within the metrology stations 116D, 116E.

The substrate rotator 180 is disposed between the metrology stations 116D, 116E. In the first metrology station 116D, the sides of the substrate (i.e., not the leading or trailing edges of the substrate while on the conveyor system 114) are inspected for chips, cracks or other defects. After the substrate 110 passes through the first metrology station 116D, the substrate rotator 180 rotates the substrates 110 either about 90 degrees or about 270 degrees about a center axis of the substrate while translating the substrate 180 degrees. By translating the substrate 180 degrees, the substrate can be picked and placed on the conveyor system 114 in essentially the same position relative to other substrates on the conveyor system 114 as the substrates travel at a high rate along the conveyor system 114. Stated differently, the substrate rotator 180 has a substrate pick-up position over a first location over the conveyor system 114, and a substrate drop-off position over a second location over the conveyor system 114, where the substrate rotator 180 translates (i.e., rotates) 180 degrees between the first and second locations over the conveyor system 114. Additionally, the substrate is rotated about 90° or about 270° about its center axis depending on the direction that the substrate rotator 180 is rotated the 180 degrees, so that the same edge (leading or trailing) of the substrate is placed on the conveyor system 114 in the same orientation regardless of the direction of rotational translation. Stated differently, while the substrate rotator 180 is rotated the 180 degrees between the first and second locations, the substrate is rotated 90 degrees. This exposes the not-yet measured sides of the substrate 110 (i.e., the leading and trailing edges prior to rotation by the substrate rotator 180) to the metrology station 116E, where inspection is performed to detect chips, cracks or other defects. Thus, each of the sides of the substrate 110 is examined by the CSI tools. More details of the substrate rotator are found in the discussion of FIG. 4 below.

The conveyor system 114 conveys the inspected substrates 110 from the modular inspection unit 104 into the sorting unit 106. The sorting unit 106 is configured to sort the substrates 110 into different categories, depending on the metrology values of each substrate found from the metrology stations 116 in modular inspection unit 104. As shown, the sorting unit 106 includes a rotary sorting system 120. The conveyor system 114 delivers inspected substrates 110 into the sorting unit 106 to a location within reach of the rotary sorting system 120. Additionally, the conveyor system 114 can continue through the sorting unit 106 to a connector 150. As such, if the sorting unit 106 is not sorting substrates 110, an inspected substrate 110 bypasses the rotary sorting system 120 of the sorting unit 106. Furthermore, if an inspected substrate 110 is not picked up by the rotary sorting system 120, the substrate continues along the conveyor system 114 toward the connector 150.

In some embodiments, substrates not picked up by the rotary sorting system 120 continue along the conveyor system 114, which leads to a non-sorted substrate bin. In some embodiments, the sorting unit 106 is further connected with additional units, such as additional inspection systems, additional sorting units, and/or additional metrology units via the connector 150. The connector 150 can further allow the conveyor system 114 to align with a conveyor system of an additional unit such as an additional inspection system, an additional sorting unit, and/or additional metrology units.

The controller 190 is configured to control and automate the inspection system 100. The controller 190 can be coupled to or in communication with one or more of the conveyor system 114, the front end 102, the modular inspection unit 104, the sorting unit 106, the transfer robot 108, the conveyor inspection system 170, the substrate rotator 180, and/or the metrology stations 116A-116E. The inspection system 100 can provide information to the controller 190 regarding substrate movement, substrate transferring, substrate sorting, and/or metrology performed.

The controller 190 includes a central processing unit (CPU) (not shown), memory (not shown), and support circuits (or I/O) (not shown). The CPU is one of any form of computer processors that are used in industrial settings for controlling various processes and hardware (e.g., pattern generators, motors, and other hardware) and monitor the processes (e.g., processing time and substrate position or location). The memory (not shown) is connected to the CPU, and is one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits include conventional cache, power supplies, clock circuits, input/output circuitry, subsystems, and the like. A program (or computer instructions) readable by the controller 190 determines which tasks are performable on a substrate. The program can be software readable by the controller 190 and can include code to monitor and control, for example, the processing time and substrate position or location within the inspection system 100.

Figure 1B:
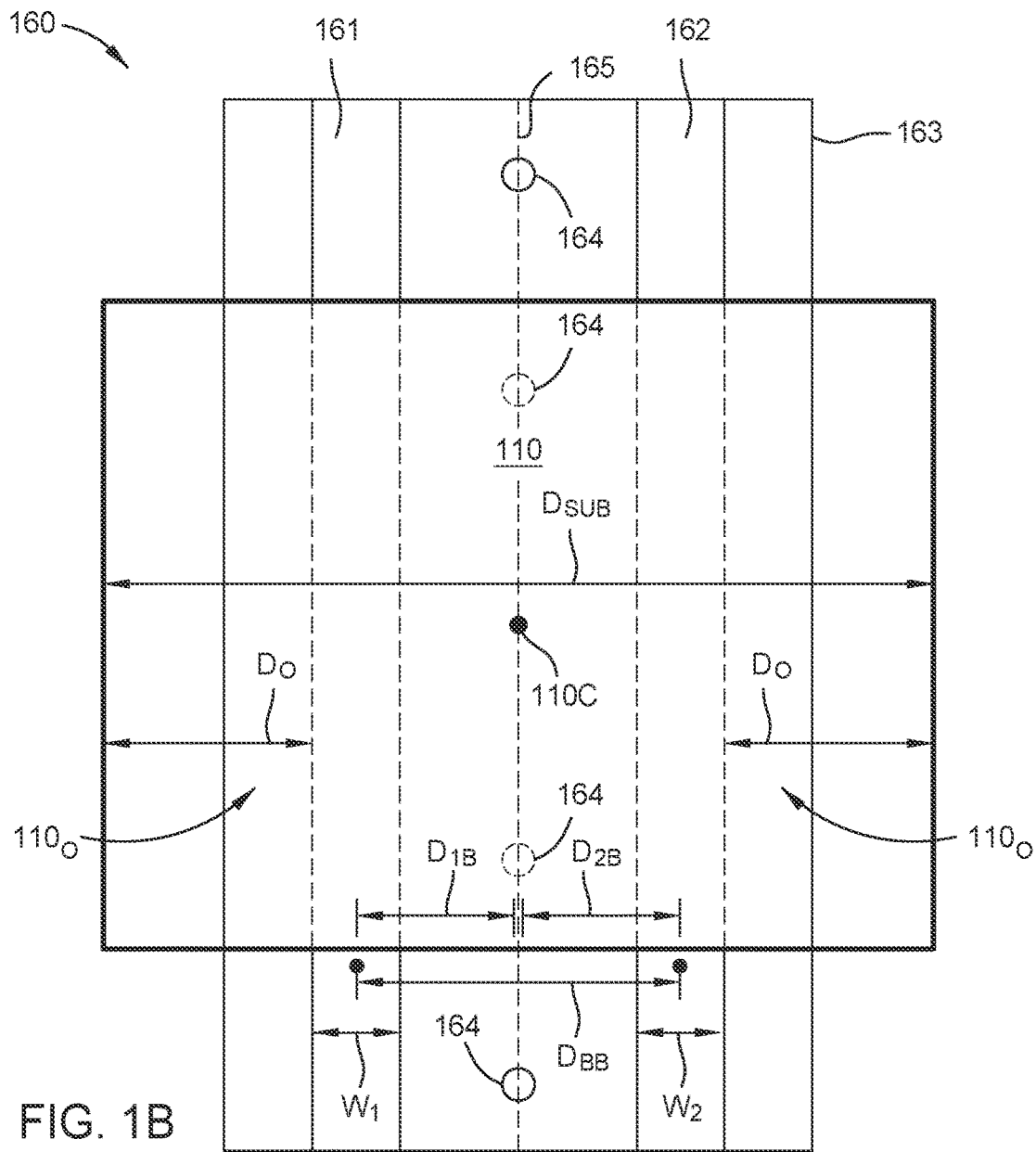
FIG. 1B illustrates a top plan view of a conveyor system, according to one embodiment.

FIG. 1B illustrates a top plan view of the conveyor system 114, according to one embodiments. The conveyor system 114 includes one or more conveyor elements 160. The conveyor system is configured to transport the substrate 110 at a speed of about 300 m/s to about 600 m/s. As described above in relation to FIG. 1A, the first conveyor apparatus 115, the intermediate conveyor apparatus 117, and the second conveyor apparatus 119 includes one or more of the conveyor elements 160. The substrate 110 lies on the conveyor element 160 while in motion. In the example depicted in FIG. 1B, the substrate 110 is a rectangular substrate suitable for manufacturing solar cells. The substrate 110 has a width $D_{sub}$ which is arranged in an orientation perpendicular to the direction of travel of the substrate 110 along the conveyor elements 160. Consequently, the length of the substrate 110 has an orientation aligned in the direction of travel of the substrate 110 along the conveyor elements 160. The substrate (or wafer) 110 can have a substrate width $D_{sub}$ from, but not limited to, about 175 mm to about 250 mm, such as from about 175 mm to about 225 mm. The length of the substrate 110 may be the same as, longer, or shorter than the width $D_{sub}$. The width $D_{sub}$ of the rectangular substrate 110 is orthogonal to a direction of travel along the first conveyor apparatus 115.

As shown, the conveyor element 160 includes a first conveyor belt 161 having a first width $W_1$ and a second conveyor belt 162 having a second width $W_2$, one or more sensors 164, and a conveyor base 163. The second conveyor belt 162 is parallel to the first conveyor belt 161. The conveyor element 160 is configured to transport the substrate 110 along a centerline 165 of the conveyor element. The first and second widths $W_1$, $W_2$ are about 8 mm to about 20 mm, such as about 8 mm to about 10 mm, or about 10 mm to about 20 mm. The first conveyor belt 161 and the second conveyor belt 162 are supported by and movable relative to the conveyor base 163.

The two conveyor belts 161, 162 are spaced apart by a belt separation pitch $D_{BB}$. The belt separation pitch $D_{BB}$ is defined between the center of the first belt 161 and the center of the second belt 162. The belt separation pitch $D_{BB}$ is from about 90 mm to about 150 mm, according to one example. The first belt pitch $D_{1B}$ is defined between the center of the first belt 161 and the centerline 165. The second belt pitch $D_{2B}$ is defined between the center of the second belt 162 and the centerline 165. The first and second belt pitches $D_{1B}$, $D_{2B}$ are from about 45 mm to about 75 mm, according to one example. The two belts 161, 162 can be shared by multiple conveyor elements 160, if multiple conveyor apparatuses are combined. The two belts 161, 162 are generally driven by a common motor (not shown) to control the motion of the substrate 110 traveling down the conveyor elements 160.

The one or more sensors 164 are disposed between the two belts 161, 162, according to one example. The one or more sensors 164 are supported by the conveyor base 163. The one or more sensors 164 may be configured for monitoring one or more properties of the substrate 110. For example, the one or more sensors 164 may be configured to monitor the resistivity and/or the thickness of the substrate 110. The one or more sensors 164 can be a part of the one or more metrology stations 116. (i.e., the one or more sensors are not a part of the metrology stations 116).

The conveyor element 160 is configured to support the substrate 110 such that portions 110o of the substrate extends beyond each of the two belts 161, 162. For example, the portions 110o have a width of about 10 mm to about 20 mm. Having the portions 110o overhanging the conveyor element 160 allows for easier imaging of the sides of the substrate 110 for defects.

It has been found that transporting the substrate 110 with a large width $D_{sub}$ using conventional transport systems results in large vibrations of edges of the substrate 110. Unwanted vibration of the substrate 110 edges results in difficulty imaging the edges of the substrate for chips or other defects. In addition, if the two belts 161, 162 are spaced too far apart, the center 110C of the substrate 110 can sag, which can cause portions of the substrate to be out of focus for imaging sensors or other sensors. The conveyor element 160 as disclosed herein results in better transport of the substrate 110 during imaging than conventional transportation systems. In other words, the conveyor element 160 results in the substrate 110 with reduced edge vibration, and reduces sagging of the center 110C of the substrate and lifting of the substrate corners.

Figure 1C:
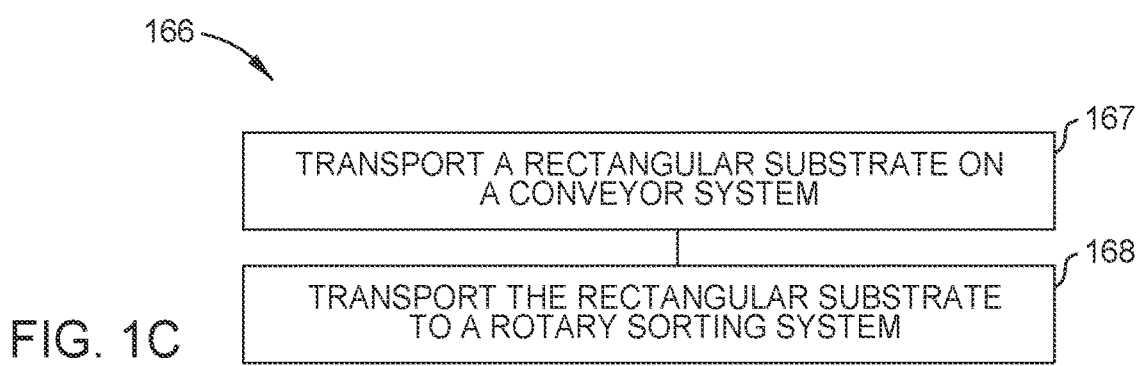
FIG. 1C is a flow diagram of a method for transporting a rectangular substrate, according to one embodiment.

FIG. 1C is a flow diagram of a method 166 for transporting a rectangular substrate (e.g., the substrate 110), according to one embodiment. Although the method operations are described in conjunction with FIGS. 1A-1C, persons skilled in the art will understand that the method 400 may be performed utilizing other equipment. The method 166 may be stored or accessible to the controller 190 as computer readable media containing instructions, that when executed by a processor of the controller 190, cause the inspection system 100 to perform the method 166.

The method 166 begins at operation 167, where the rectangular substrate is transported by a conveyor system (e.g., the conveyor system 114). The rectangular substrate has a width of about 175 mm to about 250 mm orthogonal to a direction of travel along a first conveyor apparatus (e.g., the first conveyor apparatus 115) of the conveyor system. The rectangular substrate is transported on the conveyor system at a speed of about 300 m/s to about 600 m/s. The speed of the rectangular substrate is chosen in concert with the belt pitch in order to minimize the vibrations of edges of the substrate 110. The high speeds disclosed herein increase the number of wafers inspected per hour (WPH), decreasing cost-of-ownership for the user.

At operation 168, the rectangular substrate is transported to a rotary sorting system (e.g., the rotary sorting system 120). The method 166 can also include transporting the substrate to and from the metrology stations 116, to and from the substrate rotator 180, transporting the substrate to and from the front end 102, and to and from the conveyor inspection system 170.

As described above, an inspection system is provided. The inspection system is configured to analyze substrates for chips, cracks, and other defects. The inspection system includes conveyor apparatuses, and the conveyor apparatuses include one or more conveyor elements. The conveyor elements are configured to transport solar cell substrates with large widths. The conveyor elements include belts to transport the substrates.

The spacing of the belts reduces vibrations of the substrate edge. Reducing vibrations of the substrate edges allows for more accurate imaging of the substrate edges. Accurate imaging if the substrate edges reduces false positives or negatives of substrate side imaging, reducing waste of substrates that have been inaccurately identified as damaged.

Figure 2:
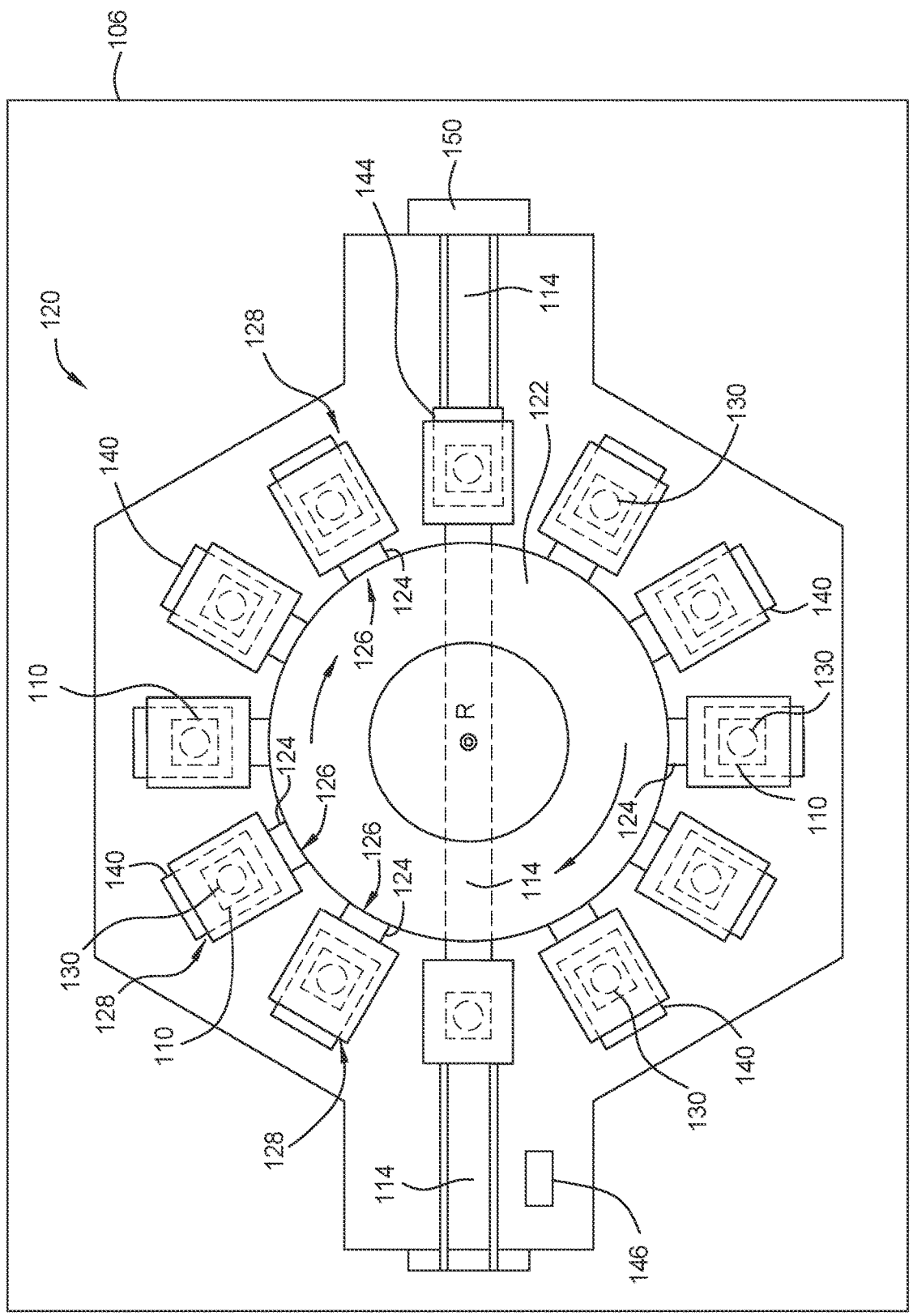
FIG. 2 illustrates a top plan view of a high speed rotary sorter, according to one embodiment.

FIG. 2 illustrates a top plan view of the rotary sorting system 120, according to on embodiment. The rotary sorting system 120 is configured to deposit substrates 110 in various bins depending on the metrology values for each substrate. As shown, the rotary sorting system 120 includes a rotatable support 122. The rotatable support 122 is configured to rotate the substrates 110 about a rotational axis R. The rotatable support 122 can be a rotary disc, a circular support, or any other shape for efficiently sorting substrates 110.

As shown, the rotatable support 122 includes a plurality of arms 124. Each arm 124 is configured to rotate a given substrate 110 about the sorting unit 106. Each arm 124 has a first end 126 and a second end 128. The first end 126 of each arm 124 is coupled to the rotatable support 122 via a suitable connection, such as, for example, a welded connection, a pinned connection, a fastened connection, etc. The second end 128 of each arm 124 extends radially outward relative to the rotational axis R. In one embodiment, the rotatable support 122 includes twelve arms 124. It is contemplated that any number of arms 124 can be included, such as ten or more arms 124, such as fourteen or sixteen arms.

At least one gripper 130 is coupled to the second end 128 of each arm 124. Each gripper 130 is disposed on a bottom side or end of each of the arms 124 so that each gripper 130 grabs the substrate 110 once the inspected substrate 110 reaches the sorting unit 106. Each gripper 130 can be a suction gripper, a claw gripper, a magnetic gripper, a picker, or other suitable gripper. In one embodiment, each gripper 130 is a Bernoulli picker.

One or more sorting bins 140 are disposed radially outward of the rotational axis R. In one embodiment, ten sorting bins 140 are utilized. It is contemplated that any number of sorting bins 140 can be utilized, such as six, eight, or twelve sorting bins 140. The sorting bins 140 can be positioned directly below the path taken by the grippers 130 as the plurality of arms 124 are rotated by the rotatable support 122. The rotary sorting system 120 rotates about the rotational axis R in a stepping fashion such that the rotary sorting system 120 stops to grip (i.e., pick up) a substrate 110 from the conveyor system 114 as each substrate 110 enters the sorting unit 106, according to one embodiment. The sorting bins 140 are positioned to receive substrates 110 from the rotary sorting system 120. The substrates 110 are sorted into the sorting bins 140 in response to one or more substrate characteristics determined during one or more of the inspection processes performed in the metrology stations 116A-116E. The rotary sorting system 120 positions the substrates 110 over a sorting bin 140 assigned to receive substrates having at least one predefined substrate characteristic. The substrate 110 is then released from the respective gripper(s) 130 into the appropriate sorting bin 140. The sorting bins 140 store the sorted substrates 110 as released by the grippers 130.

The sorting bins 140 can each be individually removable from the sorting unit 106. Each sorting bin 140 can be removable connected with the sorting unit 106, such as by an individually removable drawer or container, a slide out vessel, or pull out drawer or container. Each sorting bin 140 can be accessible from outside the sorting unit 106 such that each sorting bin 140 is removed from the sorting unit 106 without entering the sorting unit 106. A full sorting bin 140 can be removed from the sorting unit 106 by pulling the sorting bin 140 out of the sorting unit 106. Each sorting bin 140 can be removable from the sorting unit 106 while the sorting unit 106 is sorting substrates 110. As such, the sorting of substrates 110 can continue even though a particular sorting bin 140 is full or has been removed. Therefore, each sorting bin 140 can be emptied or replaced while sorting is occurring.

Additionally, the controller 190 can count the number of substrates 110 within each sorting bin 140 via the use of a counter (not shown). As such, when a particular sorting bin 140 is full or not in place, the sorting unit 106 skips the full or removed sorting bin 140 until the full or removed sorting bin 140 is emptied or replaced. Once an empty sorting bin 140 has been replaced within the sorting unit 106 the counter resets for that particular sorting bin 140. The counter can automatically reset each time the sorting bin 140 is replaced or emptied. A full sorting bin 140 can be emptied or replaced by an operator. As such, the sorting unit 106 can continue to rotate a substrate 110 until an assigned sorting bin 140 is available. If no sorting bin 140 is available, the sorting unit 106 can alert the operator and continue to rotate the substrate 110 until an appropriate sorting bin 140 becomes available. Once the controller 190 determines that a particular sorting bin 140 is approaching capacity or is at capacity, the controller 190 can alert the operator by sounding an alarm and/or displaying an alert.

Although not shown, it is contemplated that an additional sorting bins 140 can be positioned within the sorting unit 106 to receive substrates 110 that are inadvertently omitted from sorting, thus preventing damage to such substrates. While ten sorting bins 140 are shown, it is contemplated that more or less than ten sorting bins 140 can be included within the sorting unit 106, such as six, eight, eighteen, or twenty-four sorting bins 140. Additionally, a rejection bin 144 can be positioned within the sorting unit 106 to capture substrates 110 that have been rejected by one or more of the metrology stations 116A-116E of the modular inspection unit 104. As such, the rotary sorting system 120 can deliver an undesired substrate to the rejection bin 144.

The rotary sorting system 120 can also include a yield analysis server 146 accessible by one or more access panels. The yield analysis server 146 is coupled to one or more of the front end 102 and the metrology stations 116A-116E, and adapted to receive, collect, analyze, store, and/or report data received from the front end 102 and the one or more metrology stations 116A-116E with respect to each substrate 110 passing therethrough.

The rotatable support 122 is coupled with a rotary actuator (not shown), such as a pneumatic cylinder or stepper motor. The rotary actuator rotates the rotatable support 122, such as in an indexing fashion. Upon each indexing step of the rotatable support 122, a new substrate 110 is received from the modular inspection unit 104 via the conveyor system 114 onto the rotary sorting system 120 via each gripper 130. Additionally, and as further discussed infra, the rotatable support 122 can index each of the plurality of arms 124 over a respective sorting bin 140 and/or over a rejection bin 144, such that the substrate 110 is released into the sorting bin 140 or the rejection bin 144. By continually moving, or index stepping, substrates 110 can be continuously removed from the conveyor system 114, thus immediately freeing the space on the conveyor system 114 for the next substrate 110. As such, the rotary motion allows each gripper 130 to interface with each sorting bin 140 so that the substrate held by the grippers 130 will be released into one of the sorting bins 140 prior to the grippers 130 rotating back to a position to receive another substrate 110. The rotary sorting system 120 will continue to move until all substrates 110 have been sorted.

In some embodiments, the rotary sorting system 120 picks up a substrate 110 delivered from the modular inspection unit 104 via the conveyor system 114 every ⅔ of a second. In such embodiments, the rotary sorting system 120 sorts at least 5,400 substrates per hour, which is a significant improvement over conventional sorting systems.

FIG. 3A is a partial top plan view of the inspection system 100, illustrating the conveyor inspection system 170, according to one embodiment. FIG. 3B is a side plan view of the inspection system 100, illustrating the conveyor inspection system 170 in a first orientation, according to one embodiment. The conveyor inspection system 170 is configured to transmit a substrate 110 to a destination, where the destination depends on the quality of the substrate. As shown, the conveyor inspection system 170 includes the intermediate conveyor apparatus 117, a moveable conveyor actuator 209, an exit conveyor 203, an image capture device 250, one or more illumination sources 260, a rapid conveyor 210, and a waste bin 240. The conveyor actuator 209, as well as any of the other actuators described herein, can be a motor, a hydraulic actuator, a pneumatic actuator or other motion control mechanism.

As shown, the intermediate conveyor apparatus 117 includes an entry conveyor 201, a moveable conveyor 202, and a moveable conveyor actuator 209. The intermediate conveyor apparatus 117, and thus the entry conveyor 201, the moveable conveyor 202, and the exit conveyor 203, can include any device that is configured to carry a substrate along the intermediate conveyor apparatus 117. For example, the intermediate conveyor apparatus 117 may include one or more of belts, rollers, webs or other device/mechanism suitable for transporting the substrate through the intermediate conveyor apparatus 117. The intermediate conveyor apparatus 117 can further include a carrier or pallet to carry the substrate, where the carrier or pallet is moved by a drive mechanism. Each of the entry conveyor 201, the moveable conveyor 202, and the moveable conveyor actuator 209 can be individually driven.

The image capture device 250 may be a camera, a charge-coupled device (CCD), or other device suitable for determining that the substrate is unsuitable for further transport to the modular inspection unit 104. The substrate 110 can be transmitted from the front end 102, across the entry conveyor 201, the moveable conveyor 202, the exit conveyor 203, and into the modular inspection unit 104, and as such, the entry conveyor 201, the moveable conveyor 202, the exit conveyor 203 may be considered as components of the intermediate conveyor apparatus 117.

As illustrated in FIG. 3A, the translation devices 270, 272, 274 (e.g., the belts of the conveyors or equivalent) of the entry conveyor 201, the moveable conveyor 114, and the exit conveyor 203 are generally, but not required, to be aligned in a linear direction. The translation devices 272 of the moveable conveyor 114 are generally closer together than the translation devices 276 of the rapid conveyor 210. The translation devices 276 of the rapid conveyor 210 are generally narrower than a width of the substrate, such that as the moveable conveyor 114 moves between the translations device 276 of the rapid conveyor 210, the substrate is lifted off of the moveable conveyor 114 and placed on the rapid conveyor 210 as further described below.

FIG. 3B illustrates the path of an exemplary substrate 110 through the conveyor inspection system 170 in the first orientation. Substrates are disposed on the entry conveyor 201 from the cassettes (or other source) by the transfer robot 108. During the transmission of the substrate 110 across the entry conveyor 201, the portion of the entry conveyor 201 through which the substrate travels is illuminated by the one or more illumination sources 260 (illumination is illustrated by light beams 261). The portion of the entry conveyor 201 which is illuminated by the one or more illumination sources 260 is also within the field of vision of the image capture device 250. While the substrate 110 is illuminated, the image capture device 250 obtains an image of at least the edges of the substrate. Generally, the entry conveyor 201 obtains the image of the substrate 110 while the substrate is in motion across the entry conveyor 201.

The controller 190 obtains the image or image data from the image capture device 250. The controller 190 analyzes the image to determine whether the substrate 110 is undesirable or suitable for further transmission to the modular inspection unit 104. An example of an undesired substrate includes a substrate with visible damage, such as cracks, chips, or broken off corners and/or edges. In another example, an undesired substrate would include two substrates are stacked on top of one another, i.e. a double substrate. A standard picture analysis algorithm or other suitable algorithm may be used to analyze the image to determine whether the substrate 110 is undesired or suitable for further inspection. In one example, the outline of the substrate 110 is measured and the area of the substrate is calculated from the outline. If the area of the substrate 110 is smaller than a certain area limit, the substrate is considered broken, and thus undesired. If the area of the substrate 110 is larger than a certain area limit, the substrate is considered a double substrate, and thus undesired.

The controller 190 causes the conveyor inspection system 170 to direct the substrate from the moveable conveyor 202 to the exit conveyor 203 in response to a determination by the controller 190 that the substrate is desirable, or to the rapid conveyor 210 in response to a determination by the controller 190 that the substrate is undesirable. Referring back to the example of FIG. 3B, when the substrate 110 is determined to be suitable, the suitable substrate 110 is then transmitted across the moveable conveyor 202 and the exit conveyor 203 to the modular inspection unit 104.

The movable conveyor 202 is configured to convey the substrate 110 from the entry conveyor 201 to the exit conveyor 203. The movable conveyor 202 is configured to convey the substrate 110 at the same speed as the entry conveyor 201 system and the exit conveyor 203. Although the moveable conveyor 202 is illustrated to be coplanar with the entry conveyor 201 and the exit conveyor 203, any suitable arrangement of the entry conveyor, the moveable conveyor, and the exit conveyor is contemplated in the first orientation of the conveyor inspection system 170. For example, the entry conveyor 201 and/or the exit conveyor 203 can be disposed at an angle to the moveable conveyor 202, as long as the moveable conveyor 202 is configured to move the substrate from the entry conveyor to the exit conveyor while the conveyor inspection system 170 is in the first orientation.

Figure 3C:
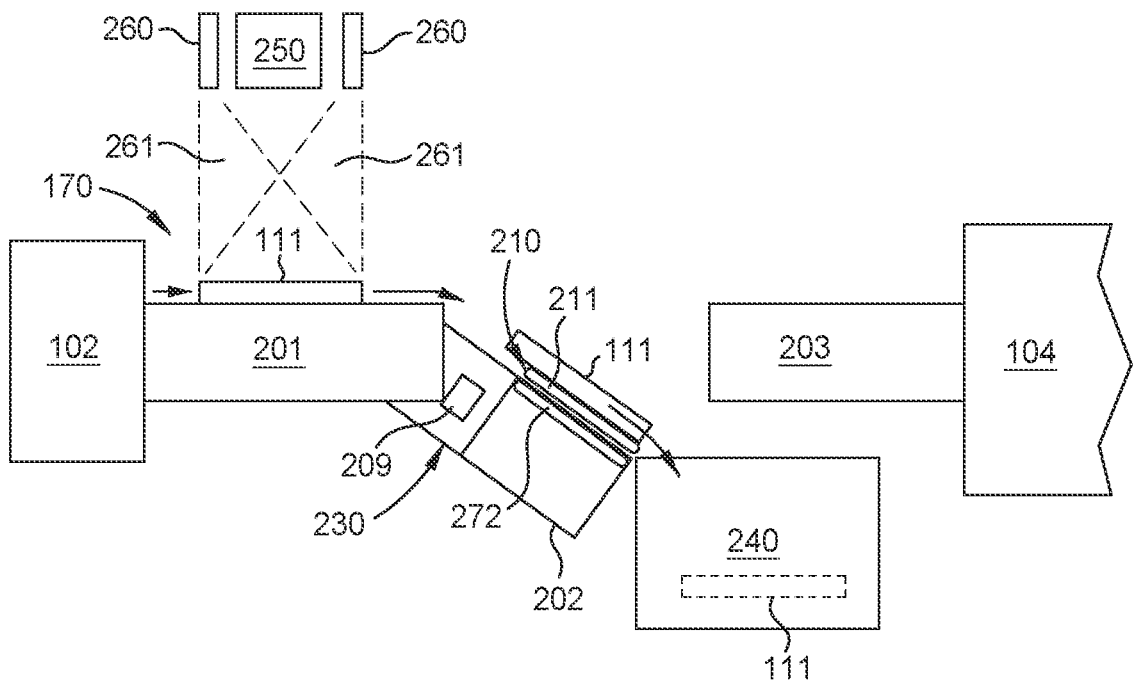
FIG. 3C illustrates a side plan view of a conveyor inspection system in a second orientation, according to one embodiment.

FIG. 3C illustrates a side plan view of the conveyor inspection system 170 in a second orientation, according to one embodiment. The path of an undesired substrate 111 (for example, a chipped substrate as determined utilizing the image capture device 250) through the conveyor inspection system 170 in the second orientation is illustrated. In response to the substrate 111 being determined as undesirable, the moveable conveyor actuator 209 rotates the moveable conveyor 202 in a direction away from the exit conveyor 203. Stated differently, the moveable conveyor actuator 209 rotates the moveable conveyor 202 from a position coplanar with the exit conveyor 203 to a position below and forming an acute angle with the exit conveyor 203.

The rapid conveyor 210 is disposed at an acute angle to and below the moveable conveyor 202 (when in the first orientation) and at an acute angle with the exit conveyor 203. The rapid conveyor 210 can include any suitable device that is configured to carry a substrate across the rapid conveyor 210. For example, the rapid conveyor 210 may include one or more of belts, rollers, webs or other device/mechanism suitable for transporting the substrate through the rapid conveyor 210. The rapid conveyor 210 can further include a carrier or pallet to carry the substrate, where the carrier or pallet is moved by a drive mechanism. The rapid conveyor 210 can be individually driven.

The rapid conveyor 210 includes a plurality of translation devices 211 (e.g., the belts of the rapid conveyor or equivalent). The rapid conveyor 210 is also disposed below the exit conveyor 203. The transition devices 211 include a plurality of lower belts, and two of the lower belts are on opposing sides of the moveable conveyor 202, according to one embodiment. The transition devices 211 are on the outside of the moveable conveyor 202 as illustrated in FIG. 3A. However, the transition devices 211 can be located anywhere, as long as the transition devices 211 are positioned as to remove the substrate when the conveyor inspection system 170 is oriented in the second orientation. The transition devices 211 are located on the inside of the moveable conveyor 202, and the moveable conveyor includes holes (not shown) that allows the transition devices 211 to pass through the holes when the moveable conveyor 202 is moved to the second orientation, according to one embodiment. The transition devices 211 are moveable into position from over the moveable conveyor 202, such that the transition devices 211 are positioned to move the substrate in the second orientation.

The moveable conveyor 202 is rotated such that the undesired substrate 111 disposed in the moveable conveyor 202 makes contact with translation devices (276, shown in FIG. 3A) of the rapid conveyor 210, thus transferring the substrate 111 from the moveable conveyor 202 to the rapid conveyor 210. The rapid conveyor 210 then transmits the undesired substrate 111 into the waste bin 240 disposed below the entry conveyor. Thus, the undesired substrate 111 is removed from the inspection system 100 before the suitable substrate can be moved to the modular inspection unit 104. Removal of the undesired substrate 111 from the inspection system 100 reduces jamming of the modular inspection unit 104, reducing cost of ownership.

The moveable conveyor 202 is configured to run at a first speed, the rapid conveyor 210 is configured to run at a second speed, and the second speed is larger than the first speed, according to one embodiment. The relative first and second speeds are determined, at least in part, by the size of the substrates 110, rate of substrate motion across the conveyor inspection system 170, and the inter-substrate distance during operation of the conveyor inspection system 170. Generally, the relative first and second speeds are selected to allow the substrate to be transferred from the moveable conveyor 202 to the rapid conveyor 210, and the moveable conveyor 202 to return to the first orientation to accept the next substrate traveling across the conveyor inspection system 170 without any interruption to the rate of substrates traveling through the inspection system 100.

The moveable conveyor 202 is generally movable between a first orientation (e.g., first position) configured to transfer substrates from the entry conveyor 201 to the exit conveyor 203, and a second orientation (e.g., second position) configured to transfer substrates from the entry conveyor 201 to the rapid conveyor 210. As illustrated in FIGS. 3B and 3C, the moveable conveyor 202 is pivotable at a first end 230 disposed closer to the entry conveyor 201. For example, the first end 230 is attached to a shaft (not shown) that allows the moveable conveyor 202 to pivot about the axis of the shaft, thus allowing the angular orientation of the moveable conveyor 202 to be controllably selected. However, in other embodiments, the moveable conveyor 202 is pivotable about an axis offset from the moveable conveyor 202 such that the first end 230 moves as the moveable conveyor 202 rotates. In any case, the moveable conveyor 202 rotates and/or moves away from the exit conveyor 203 to allow substrate to be transferred to the rapid conveyor 210 from the moveable conveyor 202.

The controller 190 can include or access non-transitory computer readable medium storing instructions. The non-transitory computer readable medium storing instructions are executable by a processor (e.g., the CPU of the controller 190). The instructions are executable by a processor to determine if the substrate 110 is defective based on the image, responsive to the substrate being defective, cause the moveable conveyor 202 to move, for example rotate, from the first orientation (e.g., the orientation illustrated in FIG. 3B) to the second orientation (e.g., the orientation illustrated in FIG. 3C) when the defective substrate is detected on the moveable conveyor 202, which causes the defective substrate to be transferred to and be carried away by the rapid conveyor 210 into the waste bin 240, and return the moveable conveyor 202 to the first orientation before a next substrate arrives on the moveable conveyor.

Although the moveable conveyor 202 in the second position is illustrated to be substantially coplanar with the rapid conveyor 210, any arrangement of the moveable conveyor and the rapid conveyor is contemplated in the second position of the conveyor inspection system 170. For example, rapid conveyor 210 can be disposed at an angle to the moveable conveyor 202, as long as the moveable conveyor 202 is configured to move the substrate from the entry conveyor to the rapid conveyor while the conveyor inspection system 170 is in the second position.

Figure 4:
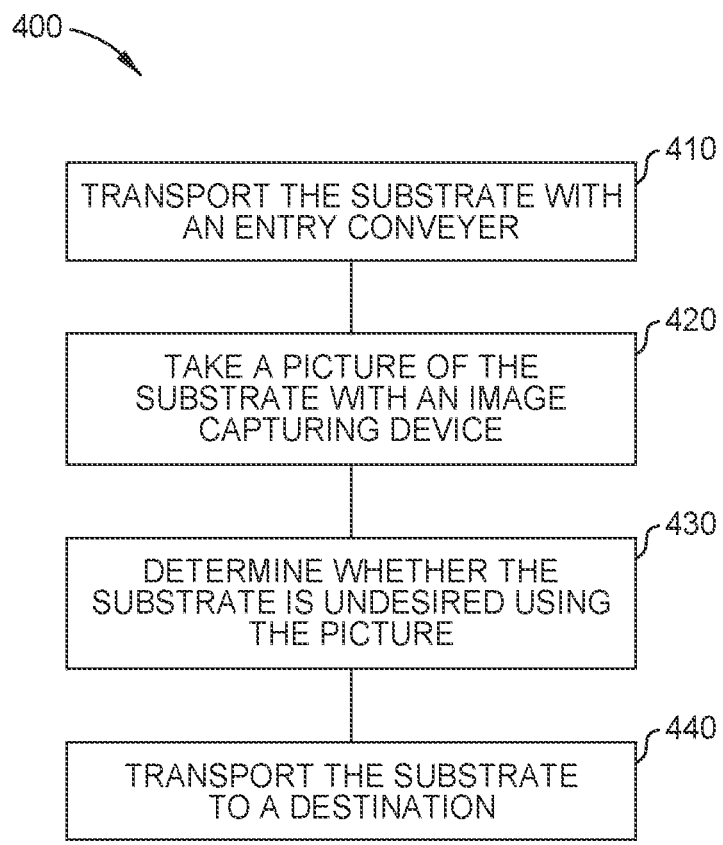
FIG. 4 is a flow diagram of method operations for sorting a substrate, according to one embodiment.

FIG. 4 is a flow diagram of a method 400 for sorting a substrate 110, according to one embodiment. Although the method operations are described in conjunction with FIGS. 3B, 3C, and 4, persons skilled in the art will understand that the method 400 may be performed utilizing other equipment. The method 400 may be stored or accessible to the controller 190 as computer readable media containing instructions, that when executed by a processor of the controller 190, cause the inspection system 100 to perform the method 400.

The method 400 begins at operation 410, where a substrate 110 is transported by an entry conveyor, such as the entry conveyor 201 of the conveyor inspection system 170.

At operation 420, an image of the substrate 110 is taken by the image capture device 250, such as a camera. In one example, the entry conveyor continues to move the substrate 110 while operation 420 is performed.

At operation 430, the image is analyzed to determine whether the substrate 110 is undesired or suitable for further inspection. A controller, such as the controller 190, determines whether the substrate 110 is undesired or suitable, according to predefined criteria, such as by comparing the captured image to a reference image obtained from an image library or derived from an algorithm. Operation 430 includes determining a measured area of the substrate 110 from the image of the substrate, and comparing the measured area to a predefined range of acceptable values to determine whether the substrate 110 is undesired or suitable for further inspection.

At operation 440, the substrate 110 is transported to a destination in response to the determination that the substrate is suitable or undesired. If the substrate 110 is determined at operation 430 as suitable for further inspection, the substrate is transmitted across the moveable conveyor 202, while in the first position, across the exit conveyor 203 to the modular inspection unit 104, as illustrated in FIG. 3B. If the substrate is determined at operation 430 as undesirable, the moveable conveyor actuator 209 moves the moveable conveyor 202 with the undesired substrate disposed thereon in a direction away from the exit conveyor 203 to the second position where the substrate is transferred from the moveable conveyor 202 to the rapid conveyor 210. In one example, the moveable conveyor 202 is rotated in a direction away from the exit conveyor 203 and between the rapid conveyor 210. The rapid conveyor 210 is disposed at an angle to the moveable conveyor 202 and below the moveable conveyor. The moveable conveyor 202 is rotated such that the undesired substrate 111 makes contact with the rapid conveyor 210, thus lifting the substrate off of the movable conveyor and onto the rapid conveyor 210. The rapid conveyor 210, moving the substrate at a speed greater than a speed that substrates are moved across the movable conveyor, then transmits the undesired substrate 111 into the waste bin 240 disposed below the entry conveyor. Once the substrate moving on the rapid conveyor 210 is clear of the moveable conveyor 202, the moveable conveyor 202 is returned to the first orientation where the moveable conveyor 202 can accept the next substrate from the entry conveyor 201.

As described above, a conveyor inspection system and a method of sorting a substrate is provided. The conveyor inspection system includes a moveable conveyor and a rapid conveyor. The moveable conveyor is configured to transfer undesired substrates to the rapid conveyor. The method includes determining that the substrate is undesirable for entry into a modular inspection unit, transferring the substrate to a rapid conveyor in response to determining that the substrate is undesirable for entry into the modular inspection unit, and transporting the substrate on the rapid conveyor.

The conveyor inspection system and method remove substrates from the test system upon first entering the test system, which reduces time wasted in analyzing undesired substrates that would be discarded. In addition, removal of undesired substrates decreases jamming of the test system, reducing cost of ownership.

Figure 5A:
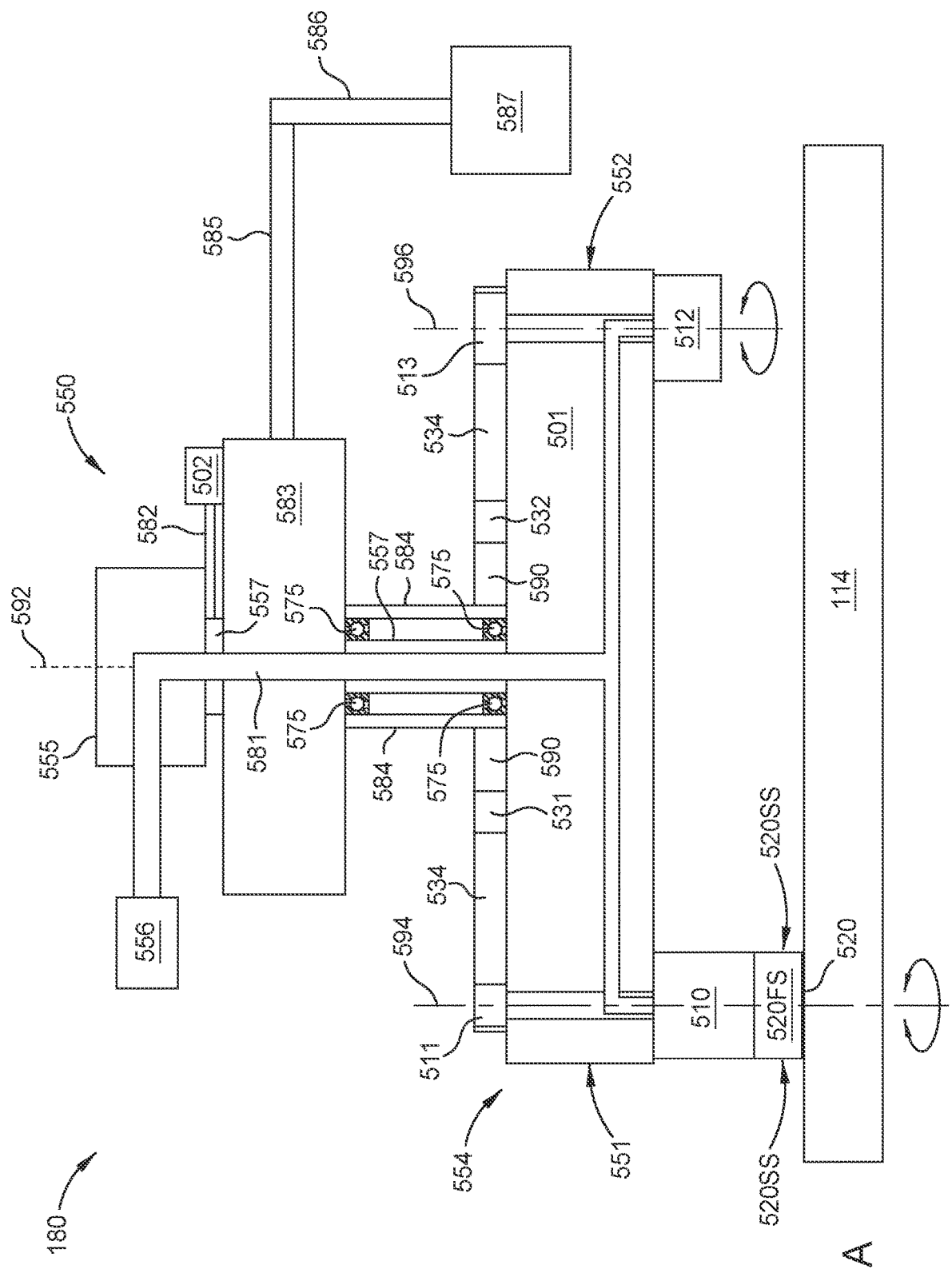
FIG. 5A illustrates a side plan view of a substrate rotator in a first orientation, according to one embodiment.
Figure 5B:
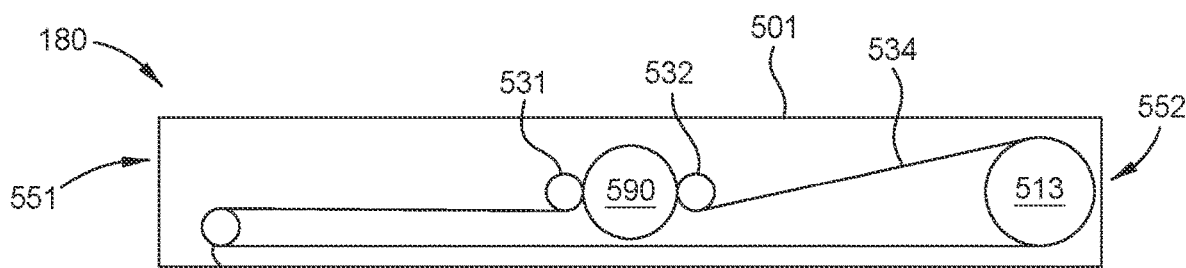
FIG. 5B illustrates a top plan view of a substrate rotator in a first orientation, according to one embodiment.

FIG. 5A illustrates a side plan view of the substrate rotator 180 in a first orientation, according to one embodiment. FIG. 5B illustrates a top plan view of the substrate rotator 180 in the first orientation, according to one embodiment. As shown, the substrate rotator 180 includes a rotating apparatus 554 and a support apparatus 550. The support apparatus 550 supports the rotating apparatus 554 as the rotating apparatus rotates.

The substrate rotator 180 includes a body 501 having first and second grippers 510, 512 coupled thereto in a manner that allows the grippers 510, 512 to be rotated in response to the rotation of the body 501. The synchronized relative motion of grippers 510, 512 and body 501 may be accomplished through the use of one or more motors, actuators, linkages, belts, gears, combinations thereof or other suitable devices. In the example described below, the synchronous rotation of the grippers 510, 512 in response to simultaneous rotation of the body 501 may be accomplished utilizing a single actuator.

The support apparatus 550 is configured to support the rotating apparatus 554. As shown, the support apparatus 550 includes a machine base 587, a stanchion 586, a support bar 585, an overhead support 583, a main actuator 502, a main belt 582, a shaft 557, a vacuum supply tube 581, a vacuum supply 556, and a rotary union 555. The overhead support 583 is coupled to the stanchion 586 by the support bar 585. The stanchion 586 is supported by the machine base 587.

The shaft 557 is connected to the main actuator 502 by the main belt 582. The shaft 557 is held by one or more bearings 575 which allow the shaft to rotate on the central axis of the shaft 557. The main actuator 502 rotates the shaft 557 via the main belt 582. The shaft 557 is disposed in a channel (not shown) in the overhead support 583, and the shaft 557 is rotated while in the channel, whereas the overhead support 583 does not rotate. The shaft 557 extends through the overhead support 583 and into the body 501 below. The shaft 557 is surrounded by the tube 584. The tube 584 is separated from the shaft 557 by the one or more bearings 575.

The vacuum supply 556 is coupled to the first and second grippers 510, 512 via the vacuum supply tube 581. The vacuum provided by the vacuum supply 556 allows the first and second grippers 510, 512 to pick up substrates, as described in further detail below. The vacuum supply tube 581 passes through the shaft 557 and into the body 501, and into the first and second gripper 510, 512. In embodiments where the first and second grippers 510, 512 do not require vacuum to function, the vacuum supply 556 and the vacuum supply tube 581 can be eliminated.

The rotating apparatus 554 is configured to rotate one or more substrates. In the example shown in FIG. 5A, the rotating apparatus 554 includes a body 501, a first gear 511, a main gear 590, a first gripper 510, a second gear 513, a second gripper 512, a belt 534, a first minor gear 531, and a second minor gear 532. The main actuator 502 is configured to rotate the shaft 557, and thus the body 501, about an axis 592. The axis 592 is generally perpendicular to the plane of the conveyor system 114 and substrates moving thereon. The axis 592 is located through the center of the body 501.

The body actuator 502 can rotate the body 501 in both a clockwise and counterclockwise direction. The body actuator 502 is configured to rotate the body 501 approximately 180 degrees between a first position and a second position. The body actuator 502 is configured to rotate the body 501 both clockwise and counterclockwise in an alternating sequence, such that grippers 510, 512 attached to the body 501 are located above and linearly aligned with the conveyor system 114 when the body 501 is in either the first position or the second position.

The body 501 is elongated, and the body 501 has a first end 551 and a second end 552. The first gripper 510 is coupled to the first end 551 such that the first gripper 510 is rotatable about a first gripper axis 594. Similarly, the second gripper 512 is coupled to the second end 552 such that the second gripper 512 is rotatable about a second gripper axis 596. The axes 594, 596 are generally parallel to axis 592, such that the grippers 510, 512 and their axes 594, 596 laterally rotate about the axis 592 as the body 501 is rotated by the body actuator 502. The first minor gear 531 and the second minor gear 532 are disposed on opposite sides of the body actuator 502 and axis 592. The main gear 590 is rotatably coupled to the body 501, and the mean gear surrounds the shaft 557. The main gear 590 is interfaced with the first minor gear 531 and the second minor gear 532 using the belt 534. As the body 501 is rotated by the body actuator 502, the main gear 590 is held stationary relative to the body 501 while the grippers 510, 512 and minor gears 531, 532 are free to laterally rotate with the body 501 about the shaft 557 on the axis 592. The relative lateral rotation of the gears 531, 532 about the main gear 590 causes the belt 534 to be driven (i.e., advanced) by the main gear 590 as the body actuator 502 rotates the body 501.

The first gear 511 is disposed at the first end 551 of the body 501. The first minor gear 531 is connected to the first gear 511 by the belt 534. The first gear 511 is coupled to the first gripper 510, such that when the first gear 511 rotates in a first direction about the axis 594, the first gripper 510 also rotates in the first direction about the axis 594. The second gear 513 is disposed at the second end 552 of the body 501. The second minor gear 532 is connected to the second gear 513 by the belt 534. The second gear 513 is coupled to the second gripper 512, such that when the second gear rotates in a first rotation about the axis 596, the second gripper 512 also rotates in the first direction about the axis 596. Since the belt 534 is coupled to both gears 531, 532, both grippers 510, 512 rotate simultaneously in a predetermined ratio in response to the grippers 510, 512 being simultaneously laterally rotated about the axis 592 by the body 501.

In one example, the belt 534 is routed such that both grippers 510, 512 turn in opposite directions when the body 501 is rotated in one direction. In another embodiment, the belt 534 is routed such that both grippers 510, 512 turn in the same direction when the body 501 is rotated in one direction, for example, by twisting the belt 534 between one of the gears 531, 532 and main gear 590. Alternatively, the relative direction of simultaneous rotation of the grippers 510, 512 may be selective through use of multiple belts, gears or other mechanisms. In embodiments where the simultaneous rotation of the grippers 510, 512 is in opposite directions, the substrate rotator 180 is configured so that one gripper rotates 180 degrees more than the other gripper, for example rotating 90 degrees compared to 270 degrees in response to a 180 degrees rotation of the body 501. In embodiments where the simultaneous rotation of the grippers 510, 512 is in the same direction, the substrate rotator 180 is configured so that one gripper rotates the same amount as the other gripper, for example both grippers 510, 512 rotating 90 degrees in response to a 180 degrees rotation of the body 501.

In one example, the body 501 is rotated in a first direction to rotate a substrate held in the first gripper 510 to a position closer to the next station 116 while the second gripper 512, empty of substrates, is moved to position to receive the next substrate advancing down the conveyor system 114. While the first gripper is rotating in the first direction, the substrate is turned such that one of the trailing or leading edge of the substrate (as oriented in the prior station 116). Thereafter, the second gripper 512 picks up the next substrate advancing down the conveyor system 114, and as the body 501 rotates the second gripper 512 and substrate in a second direction to the closer to the next station 116, the substrate is rotated in to the same orientation that the prior substrate was placed back on the conveyor system 114 by the first gripper 510. When the body 501 rotates in opposite first and second directions, twisting of electrical and fluid conduits within the substrate rotator 180 are substantially eliminated.

The first gripper 510 and the second gripper 512 are configured to grasp a first substrate and a second substrate, respectively. Each gripper 510, 512 can be a suction gripper, an electrostatic chuck (ESC), a claw gripper, a magnetic gripper, a picker, or other suitable gripper. In one embodiment, each gripper 510, 512 is a Bernoulli picker.

In the example depicted in FIG. 5B, the gear ratio between the first gear 511 and the main gear 590 is 2:1, such that the first gripper 510 rotates at half the first angle that the body actuator rotates. For example, if the body actuator 502 rotates the body 501 about 180 degrees, the first gripper 510 rotates about 90 degrees. The gear ratio between the main gear 590 and the second gear 513 is 1:1.5, such that the second gripper 512 rotates at three halves the first angle that the body 501 rotates. For example, if the body actuator 502 rotates the body 501 about 180 degrees, the second gripper 512 rotates about 270 degrees.

Although the first and second grippers 510, 512 illustrated in FIGS. 5A-5F are coupled to the body actuator 502 by the belt 534 and gears 511, 513, 531, 532, 590, other coupling devices can be used. For example, the gears 511, 513 directly couple to the main gear 590. In other examples, linkages may couple the body actuator 502 to the first and second grippers 510, 512. In another example, individual actuators (not shown) are coupled to, and rotate, the first and second grippers 510, 512 independently of the body actuator 502.

Figure 5D:
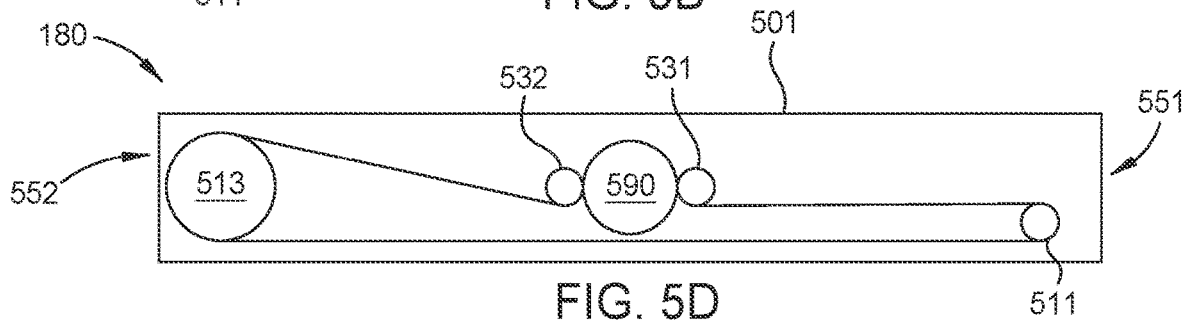
FIG. 5D illustrates a top plan view of a substrate rotator in a second configuration, according to one embodiment.
Figure 5F:
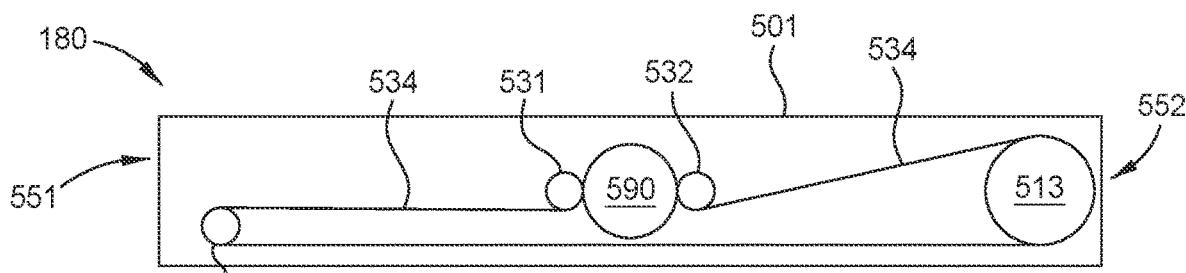
FIG. 5F illustrates a top plan view of a substrate rotator in a third configuration, according to one embodiment.
Figure 6:
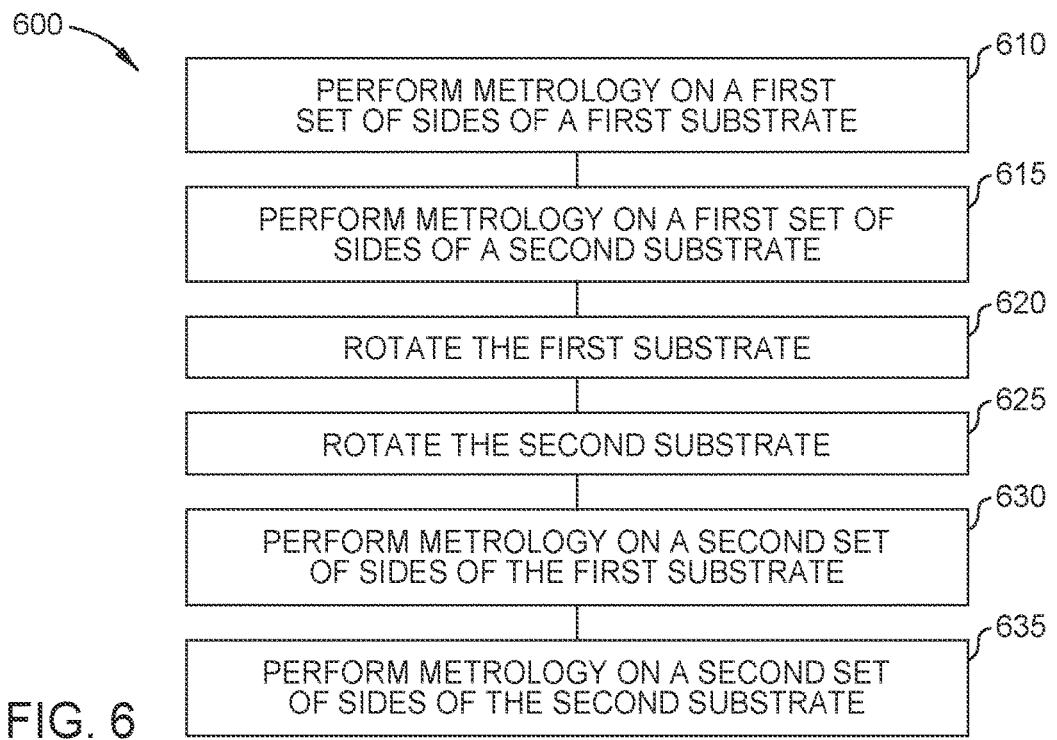
FIG. 6 is a flow diagram of method operations for performing metrology on a substrate, according to one embodiment.

FIG. 6 is a flow diagram of a method 600 for performing metrology on a substrate, according to one embodiment. Although the method operations are described in conjunction with FIGS. 5A-5F and 6, persons skilled in the art will understand that any system configured to perform the method operations, in any order, falls within the scope of the embodiments described herein. The method 600 may be stored or accessible to the controller 190 as computer readable media containing instructions, that when executed by a processor of the controller 190, cause the inspection system 100 to perform the method 600.

The method 600 begins at operation 610, where metrology is performed on the first set of sides of a substrate, such as a first set of sides 520FS of a first substrate 520. The metrology can be performed at a metrology station 116D. The metrology station 116D includes a CSI, and the CSI images the first set of sides 520FS of the first substrate 520 as the substrate passes the metrology stations 116D to check for chips, cracks, or other defects on the first set of sides of the substrate. The first set of sides 520FS of the first substrate 520 is parallel to the direction the substrate moves down the conveyor system 114, according to one embodiment.

At operation 615, metrology is performed on a first set of sides 521S of a second substrate 521. The metrology can be performed at a metrology station 116D. The metrology station 116D includes a CSI, and the CSI images the first set of sides 521FS of the second substrate 521 as the second substrate passes the metrology stations 116D to check for chips, cracks, or other defects on the first set of sides of the substrate. The first set of sides 521FS of the second substrate 521 is parallel to the direction the substrate moves down the conveyor system 114, according to one embodiment.

At operation 620, the first substrate 520 is rotated by a first angle, such that a second set of sides 520SS of the first substrate is in the same orientation as the first set of sides 520FS was before the rotating the first substrate. The substrate 520 can be picked from an upstream location of the conveyor system 114. The first substrate 520 is square, and the first angle is about 90 degrees, according to one embodiment. The conveyor system 114 can stop, and the first substrate 520 can be rotated at rest, according to one embodiment. The conveyor system 114 can be in motion while the first substrate 520 is rotated, but this requires the first substrate 520 to be placed farther down the conveyor system 114 when the rotation is complete. If the first substrate 520 is not placed farther down the conveyor system 114, the substrate 520 can be undesirably placed on another substrate.

In some embodiments, the operation 620 is performed by the substrate rotator 180. FIGS. 5A and 5B illustrate the substrate rotator 180 in the first orientation, where the substrate rotator grasps the first substrate 520 with the first gripper 510. The first substrate 520 is rotated about 90 degrees about a centerline of the first substrate while laterally rotating the first substrate 180 degrees in a first direction, according to one embodiment. The first substrate 520 is rotated about 270 degrees about a centerline of the first substrate while laterally rotating the first substrate 180 degrees in a first direction, according to one embodiment. In either case, the first substrate 520 is rotated such that the second set of sides 520SS is disposed in the same facing direction as the first set of sides 520FS was located. In embodiments where the first and second grippers 510, 512 are Bernoulli pickers, the first substrate 520 is picked up by the first gripper 510 without motion of the first gripper in the z-direction (i.e., away from the surface of the conveyor system 114, and/or away from the top surface of the first substrate 520). The Bernoulli picker uses vacuum to attract and grasp the first substrate 520, and thus motion of the first gripper 510 in the z-direction is not necessary. The second substrate 521 continues to move down the conveyor system 114, and thus the picked-up first substrate 520 partially overlaps the second substrate 521 before the substrate rotator 180 is rotated, according to one embodiment.

Figure 5C:
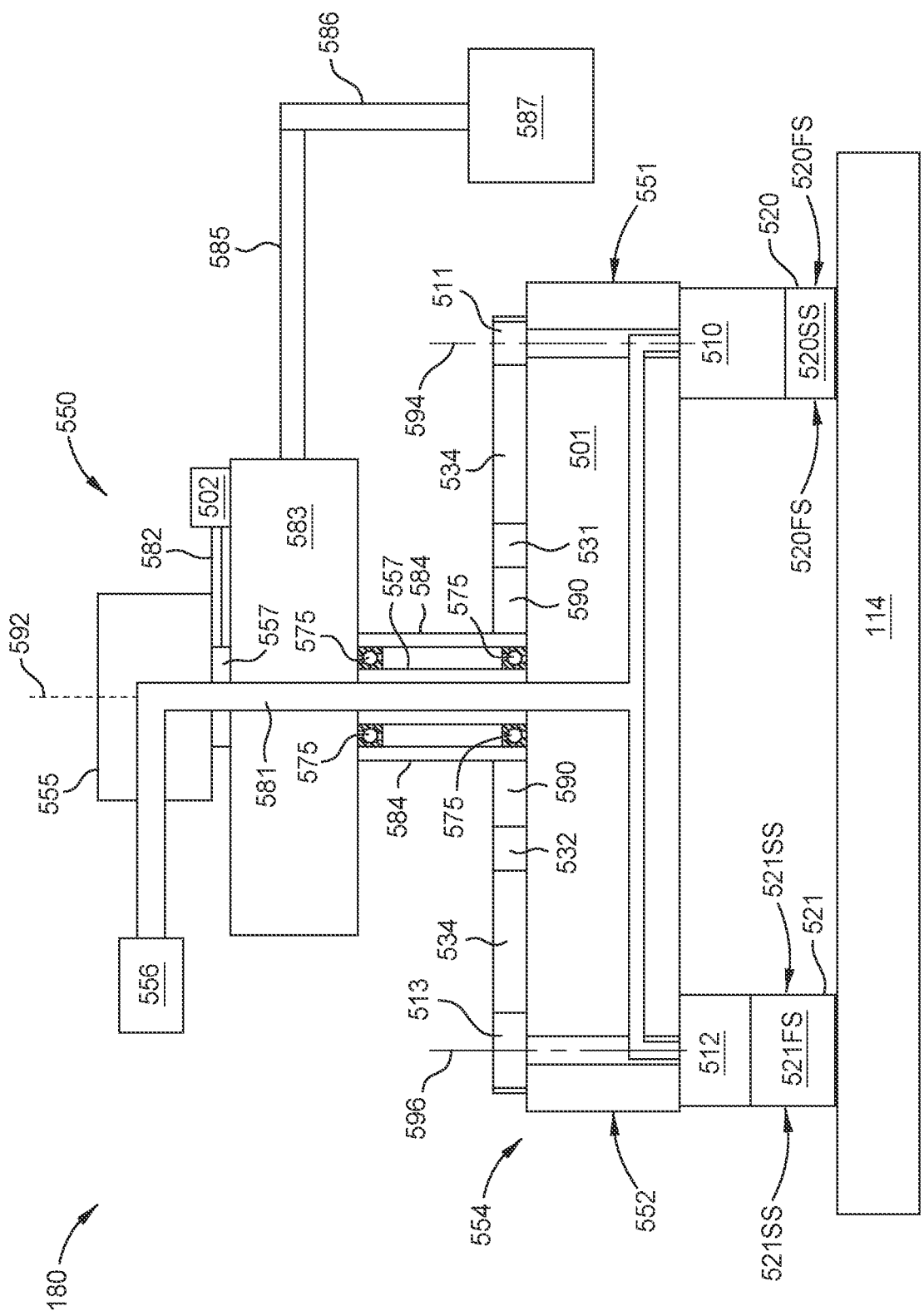
FIG. 5C illustrates a side plan view of a substrate rotator in a second orientation, according to one embodiment.

FIG. 5C illustrates a side plan view of the substrate rotator 180 in a second orientation, according to one embodiment. FIG. 5D illustrates a top plan view of the substrate rotator 180 in the second orientation, according to one embodiment. In this embodiment, the second orientation illustrates the substrate rotator 180 rotated about 180° with respect to the first orientation. If the gear ratio between the first gear 511 and the gear of the body actuator 502 is 2:1, then the first gripper 510 also rotates about 90 degrees. The substrate 520 is rotated a total of 180 degrees+90 degrees=270 degrees with respect to the original orientation of the substrate. Thus, the first set of sides 520FS is perpendicular to the direction the substrate 520 moves down the conveyor system 114. Also, the second set of sides 520SS is parallel to the direction the substrate 521 moves down the conveyor system 114. Finally, the length of the body 501 and the rotation speed of the body actuator 502 can be chosen such that the substrate 520 is placed the correct distance down the conveyor system 114 that maintains sufficient substrate spacing. The substrate 520 continues moving down the conveyor system 114 to the metrology station 116E.

In addition, FIGS. 5C and 5D illustrate the second gripper 512 grasping a second substrate 521, with a first set of sides 521FS of the second substrate parallel to the direction the substrate moves down the conveyor system 114. The second substrate 521 can be picked from an upstream location of the conveyor system 114. The second gripper 512 allows for rotation of the second substrate 521 as well, as further described below. Grasping the second substrate 521 increases the efficiency of the method by doubling the number of substrates that are reoriented in the same timeframe. The second substrate 521 is rotated about −270 degrees about a centerline of the second substrate while laterally rotating the second substrate 180 degrees in a direction opposite the first direction, according to one embodiment. The second substrate 521 is rotated about −90 degrees about a centerline of the second substrate while laterally rotating the second substrate 180 degrees in a direction opposite the first direction, according to one embodiment. In either case, the second substrate 521 is rotated such that the second set of sides 521SS is disposed in the same facing direction as the first set of sides 521FS was located. In embodiments where the first and second grippers 510, 512 are Bernoulli pickers, the second substrate 521 is picked up by the second gripper 512 without motion of the second gripper in the z-direction (i.e., away from the surface of the conveyor system 114). The Bernoulli picker uses vacuum to attract and grasp the second substrate 521, and thus motion of the second gripper 512 in the z-direction is not necessary. In addition, the when vacuum is reduced in the Bernoulli picker, the first substrate 520 drops onto the conveyor apparatus 114 without movement of the Bernoulli picker in the z-direction.

At operation 625, the second substrate 521 is rotated by a second angle, such that a second set of sides 521SS of the second substrate is in the same orientation as the first set of sides 521FS was before the rotating the second substrate. The second substrate 521 is square, and the second angle is about 270°, according to one embodiment. The conveyor system 114 can stop, and the second substrate 521 can be rotated at rest, according to one embodiment. The conveyor system 114 can be in motion while the second substrate 521 is rotated, but this requires the second substrate 521 to be placed farther down the conveyor system 114 when the rotation is complete. If the second substrate 521 is not placed farther down the conveyor system 114, the second substrate 521 can be undesirably placed on another substrate.

FIG. 5E illustrates a side plan view of the substrate rotator 180 in a third orientation, according to one embodiment. FIG. 5F illustrates a top plan view of the substrate rotator 180 in the third orientation, according to one embodiment. In this embodiment, the third orientation illustrates the substrate rotator 180 rotated about −180 degrees with respect to the second orientation. Thus, the third orientation of the substrate rotator 180 is similar to the first orientation.

If the gear ratio between the second gear 513 and the gear of the body actuator 502 is 3:2, then the second gripper 512 also rotates about −270 degrees. The second substrate 521 is rotated a total of −180 degrees−270 degrees=−90 degrees=270 degrees with respect to the original orientation of the second substrate. Thus, the second set of sides 521FS is perpendicular to the direction the substrate 521 moves down the conveyor system 114. Also, the second set of sides 521SS is parallel to the direction the substrate 521 moves down the conveyor system 114. Finally, the orientation of the first substrate 520 and the second substrate 521 is the same, i.e. rotated 270 degrees with respect to the original orientation of the first substrate 520 and the second substrate 521.

At operation 630, metrology is performed on a second set of sides of a substrate, such as the second set of sides 520SS of the first substrate 520. The metrology can be performed at a metrology station 116E. The metrology station 116E includes a CSI, and the CSI images the second set of sides 520SS of the first substrate 520 as the substrate passes the metrology station 116E to check for chips, cracks, or other defects on the first set of sides of the substrate. The second set of sides 520SS of the first substrate 520 is parallel to the direction the substrate moves down the conveyor system 114, according to one embodiment. Thus, the method 600 results in metrology of multiple sets of sides 520FS, 520SS of the first substrate 520.

At operation 635, metrology is performed on the second set of sides 521SS of the second substrate 521. The metrology can be performed at a metrology station 116E. The metrology station 116E includes a CSI, and the CSI images the second set of sides 521SS of the second substrate 521 as the substrate passes the metrology station 116E to check for chips, cracks, or other defects on the first set of sides of the substrate. The second set of sides 521SS of the second substrate 521 is parallel to the direction the substrate moves down the conveyor system 114, according to one embodiment. Thus, the method 600 results in metrology of multiple sets of sides 521FS, 521SS of the second substrate 521.

Figure 7A:
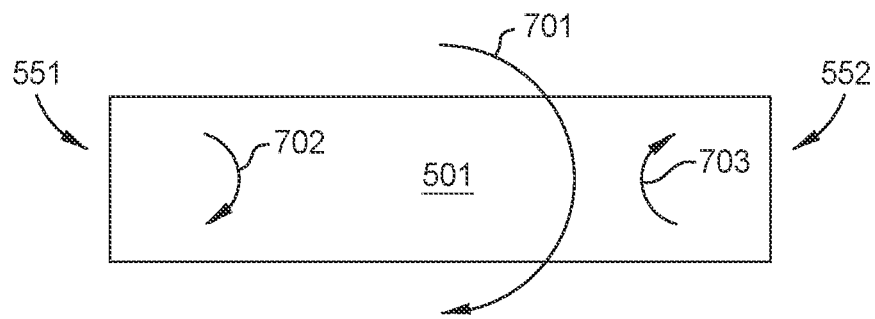
FIG. 7A illustrates a schematic view of a body rotating in a first direction, according to one embodiment.

In one example, the body 501 rotates in a first direction in one step, and the body rotates in the opposite direction in the second step. FIG. 7A illustrates a schematic view of the body 501 rotating in a first direction, according to one embodiment. FIG. 7A illustrates the same motion that is present between FIGS. 5B and 5D. The body 501 rotates in the first direction (shown by arrow 701). The first gripper rotates in a direction (shown by arrow 702) that is the same direction as the first direction of the body 501. The second gripper rotates in a direction (shown by arrow 703) that is the opposite direction as the first direction of the body 501. For example, the body 501 rotates 180 degrees in the first direction, the first gripper rotates 90 degrees in the first direction, and the second gripper rotates −270 degrees in the first direction.

Figure 7B:
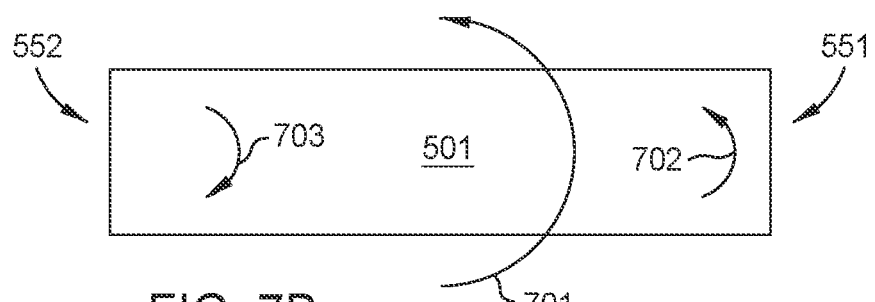
FIG. 7B illustrates a schematic view of a body rotating in a second direction, according to one embodiment.

FIG. 7B illustrates a schematic view of the body 501 rotating in a second direction, according to one embodiment. FIG. 7B illustrates the same motion that is present between FIGS. 5D and 5F. The body 501 rotates in the second direction (shown by arrow 701). The second direction is opposite to the first direction. The first gripper rotates in a direction (shown by arrow 702) that is the same direction as the second direction of the body 501. The second gripper rotates in a direction (shown by arrow 703) that is the opposite direction as the second direction of the body 501. For example, the body 501 rotates 180 degrees in the second direction, the first gripper rotates 90 degrees in the second direction, and the second gripper rotates −270 degrees in the second direction. Thus, the body 501 and first and second grippers end up in the same orientation that they began. The motion of the body 501 illustrated in FIGS. 7A, 7B can use an actuator (e.g., the main actuator 502) that rotates only 180 degrees, and does not have to rotate a full 360 degrees.

Figure 7C:
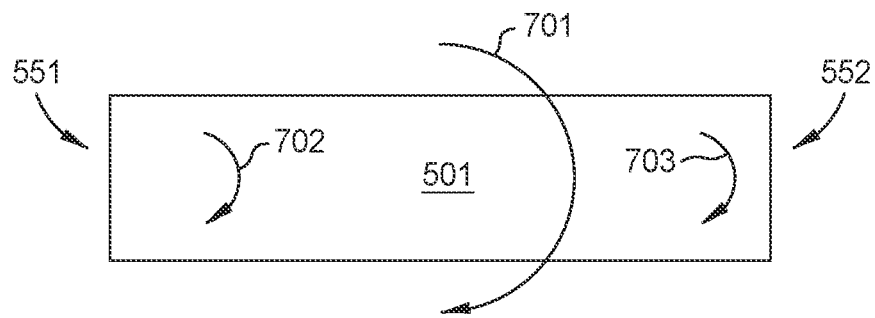
FIG. 7C illustrates a schematic view of a body rotating in a first direction, according to one embodiment.

In another example, the body 501 rotates in a first direction in one step, and the body rotates in the same direction in the second step. FIG. 7C illustrates a schematic view of the body 501 rotating in a first direction, according to one embodiment. The body 501 rotates in the first direction (shown by arrow 701). The first gripper rotates in a direction (shown by arrow 702) that is the same direction as the first direction of the body 501. The second gripper rotates in a direction (shown by arrow 703) that is the same direction as the first direction of the body 501. For example, the body 501 rotates 180 degrees in the first direction, the first gripper rotates 90 degrees in the first direction, and the second gripper rotates 270 degrees in the first direction.

Figure 7D:
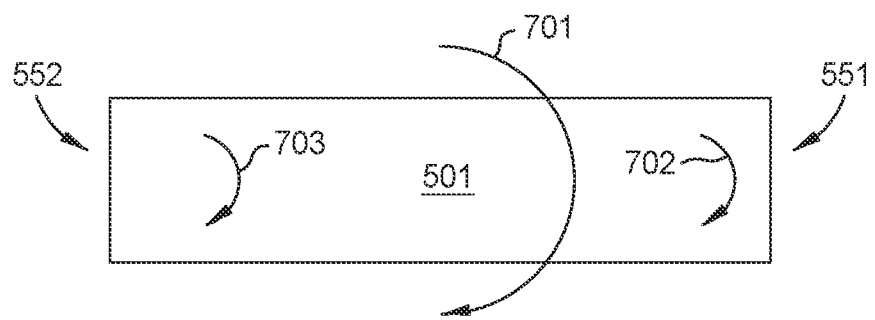
FIG. 7D illustrates a schematic view of a body rotating in a second direction, according to one embodiment.

FIG. 7D illustrates a schematic view of the body 501 rotating in a second direction, according to one embodiment. The body 501 rotates in the second direction (shown by arrow 701). The first gripper rotates in a direction (shown by arrow 702) that is the same direction as the first direction of the body 501. The second gripper rotates in a direction (shown by arrow 703) that is the same direction as the first direction of the body 501. For example, the body 501 rotates 180 degrees in the second direction, the first gripper rotates 90 degrees in the second direction, and the second gripper rotates 270 degrees in the second direction. Thus, the body 501 and first and second grippers end up in the same orientation that they began. The motion of the body 501 illustrated in FIGS. 7C, 7D can use an actuator (e.g., the main actuator 502) that rotates in one direction, and does not have to rotate backwards.

As described above, a substrate rotator, a substrate edge metrology system, and a method of rotating a substrate are provided. The substrate rotator includes a body having a first end and a second end, a body actuator coupled to the body between the first and second ends and configured to rotate the body, a first gripper coupled to the first end, and a second gripper coupled to the second end. The substrate rotator is configured to rotate one or more substrates, while moving the substrate further along a conveyor. The substrate edge metrology system includes two metrology systems and the substrate rotator. The substrate edge metrology system measures side chips or other defects on all sides of the substrate by rotating the substrate in between metrology stations. The method includes performing metrology on a first set of sides of the first substrate, rotating the first substrate by a first angle, and performing metrology on the second set of sides of the first substrate. The method allows for measuring side chips or other defects on all sides of the substrate.

Substrates passing through the substrate edge metrology system analyzes side chips or other defects on all sides of the substrate, allowing for easier recognition and removal of undesired substrates. Unlike conventional metrology substrates, the substrate rotator allows for measuring of all sides of the substrate without having to stop the conveyor.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A system for inspecting a rectangular substrate having a width between about 175 mm and about 250 mm, comprising:
    one or more metrology stations configured to inspect the rectangular substrate; and
    a conveyor system configured to transport the rectangular substrate while the one or more metrology stations inspect the rectangular substrate, comprising:
        a conveyor inspection system comprising:
            a moveable conveyor configured to rotate from a first orientation to a second orientation; and
            a rapid conveyor disposed at an angle to the moveable conveyor and below the moveable conveyor, the rapid conveyor configured to lift the rectangular substrate off of the moveable conveyor as the moveable conveyor is rotating to the second orientation;
        a first conveyor apparatus; and
        a second conveyor apparatus, each of the conveyor inspection system, the first conveyor apparatus, and the second conveyor apparatus comprising one or more conveyor elements comprising:
            a first conveyor belt and a second conveyor belt parallel to the first conveyor belt, wherein the first conveyor belt and the second conveyor belt are configured to transport the rectangular substrate having the width between about 175 mm to about 250 mm in a direction of travel while the width of the rectangular substrate is orthogonal to the direction of travel, and the first conveyor belt and the second conveyor belt are spaced apart by a belt separation pitch between 90 mm and 150 mm.

2. The system of claim 1, wherein the one or more conveyor elements further comprise a plurality of sensors disposed between the first conveyor belt and the second conveyor belt.

3. The system of claim 2, wherein the one or more metrology stations also comprise the plurality of sensors.

4. The system of claim 2, wherein a center of the first conveyor belt is disposed a first belt pitch from a centerline of the conveyor element, a center of the second conveyor belt is disposed a second belt pitch from the centerline, and the width of the first and second conveyor belts is about 8 mm to about 10 mm.

5. The system of claim 1, the conveyor inspection system further comprising:
    an entry conveyor, the moveable conveyor positioned to receive the rectangular substrate from the entry conveyor;
    an image capturing device positioned to obtain an image of the rectangular substrate disposed on the entry conveyor; and
    an illumination source, wherein the illumination source is configured to emit illumination light onto the entry conveyor in a field of view of the image capturing device, wherein the conveyor inspection system is configured to transport the rectangular substrate from the first conveyor apparatus to the second conveyor apparatus.

6. The system of claim 5, wherein the conveyor inspection system further comprises an exit conveyor positioned to receive the rectangular substrate from the moveable conveyor in the first orientation.

7. The system of claim 6, wherein the conveyor inspection system further comprises a rapid conveyor actuator configured to rotate the moveable conveyor a first angle with respect to the exit conveyor.

8. The system of claim 7, wherein the rapid conveyor is positioned to move the rectangular substrate to a waste bin.

9. The system of claim 1, further comprising:
a substrate rotator, comprising:
  a body having a first end and a second end;
  a body actuator coupled to the body between the first and second ends and configured to rotate the body;
  a first gripper coupled to the first end, the first gripper configured to rotate by a first rotation in response to a 180 degree rotation of the body, the first gripper configured to rotate a first substrate retained in the first gripper by the first rotation; and
  a second gripper coupled to the second end, the second gripper configured to rotate a second rotation in response to a 180 degree rotation of the body, the second gripper configured to rotate a second substrate retained by the second gripper by the second rotation, wherein an absolute value of the second rotation is greater than the first rotation; wherein the substrate rotator is configured to transport the rectangular substrate from a first portion of the second conveyor apparatus to a second portion of the second conveyor apparatus.

10. The system of claim 9, wherein the first gripper and the second gripper are configured to rotate at different speeds.

11. The system of claim 9, further comprising:
a shaft coupling the body to the body actuator;
a tube surrounding the shaft;
a main gear surrounding the tube;
a belt coupled to the main gear;
a first gear coupled to the belt; and
a second gear coupled to the belt.

12. The system of claim 11, wherein the main gear, the first gear, and the second gear have different radii than each other.

13. The system of claim 12, wherein the gear ratio between the first gear and the main gear is about 2:1, and the gear ratio between the main gear and the second gear is about 1:1.5.

14. A system for inspecting a rectangular substrate having a width between about 175 mm and about 250 mm, comprising:
a front end;
one or more metrology stations configured to inspect the rectangular substrate; and
a conveyor system configured to transport the rectangular substrate while the one or more metrology stations inspect the rectangular substrate, comprising:
  a conveyor inspection system comprising:
    a moveable conveyor configured to rotate from a first orientation to a second orientation; and
    a rapid conveyor disposed at an angle to the moveable conveyor and below the moveable conveyor, the rapid conveyor configured to lift the rectangular substrate off of the moveable conveyor as the moveable conveyor is rotating to the second orientation;
  a first conveyor apparatus; and
  a second conveyor apparatus, each of the conveyor inspection system, the first conveyor apparatus, and the second conveyor apparatus comprising one or more conveyor elements comprising:
    a first conveyor belt and a second conveyor belt parallel to the first conveyor belt, wherein the first conveyor belt and the second conveyor belt are configured to transport the rectangular substrate having the width between about 175 mm to about 250 mm in a direction of travel while the width of the rectangular substrate is orthogonal to the direction of travel, the first conveyor belt and the second conveyor belt are spaced apart by a belt separation pitch between 90 mm and 150 mm, and the front end is configured to transport the rectangular substrate to the conveyor system.

15. The system of claim 14, wherein the each of the one or more conveyor elements further comprise a plurality of sensors disposed between the first conveyor belt and the second conveyor belt.

16. The system of claim 15, wherein the one or more metrology stations also comprise the plurality of sensors.

17. The system of claim 15, wherein a center of the first conveyor belt is disposed a first belt pitch from a centerline of the conveyor element, a center of the second conveyor belt is disposed a second belt pitch from the centerline, and the width of the first conveyor belt and the second conveyor belt is about 8 mm to about 10 mm.

* * * * *